(12) United States Patent
Lee et al.

(10) Patent No.: US 12,129,416 B2
(45) Date of Patent: Oct. 29, 2024

(54) QUANTUM DOT COMPOSITION, LIGHT EMITTING ELEMENT, AND METHOD FOR MANUFACTURING THE SAME

(71) Applicant: Samsung Display Co., Ltd., Yongin-si (KR)

(72) Inventors: Changhee Lee, Seoul (KR); Yunku Jung, Cheonan-si (KR); Hyunmi Doh, Seoul (KR); Hyojin Ko, Seoul (KR); Dukki Kim, Suwon-si (KR); Sehun Kim, Yongin-si (KR); Jaehoon Kim, Seoul (KR); Jaekook Ha, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 592 days.

(21) Appl. No.: 17/219,653

(22) Filed: Mar. 31, 2021

(65) Prior Publication Data
US 2021/0371738 A1    Dec. 2, 2021

(30) Foreign Application Priority Data

Jun. 2, 2020  (KR) .................. 10-2020-0066720

(51) Int. Cl.
| | | |
|---|---|---|
| *C09K 11/06* | (2006.01) | |
| *B82Y 20/00* | (2011.01) | |
| *B82Y 30/00* | (2011.01) | |
| *B82Y 40/00* | (2011.01) | |
| *H10K 50/115* | (2023.01) | |
| *H10K 102/00* | (2023.01) | |

(52) U.S. Cl.
CPC ............ *C09K 11/06* (2013.01); *H10K 50/115* (2023.02); *B82Y 20/00* (2013.01); *B82Y 30/00* (2013.01); *B82Y 40/00* (2013.01); *C09K 2211/10* (2013.01); *H10K 2102/00* (2023.02)

(58) Field of Classification Search
None
See application file for complete search history.

(56) References Cited

U.S. PATENT DOCUMENTS

| 8,597,730 B2 | 12/2013 | Pickett et al. |
|---|---|---|
| 10,287,498 B2 | 5/2019 | Zhou et al. |
| 10,439,155 B2 | 10/2019 | Kim et al. |
| 10,804,417 B2 | 10/2020 | Pschenitzka et al. |

(Continued)

FOREIGN PATENT DOCUMENTS

| CN | 110361933 A | * 10/2019 | ............... C08K 3/10 |
|---|---|---|---|
| KR | 10-1700382 B1 | 1/2017 | |

(Continued)

OTHER PUBLICATIONS

CN 110361933 A eng translation (Year: 2019).*

(Continued)

*Primary Examiner* — Jeffrey D Washville
(74) *Attorney, Agent, or Firm* — Lewis Roca Rothgerber Christie LLP

(57) ABSTRACT

A quantum dot composition includes a quantum dot having a surface to which a ligand is bonded, and a photoacid generator. The quantum dot composition according to one or more embodiments may be applied to an emission layer of a light emitting element and a display device, thereby improving luminous efficiency of the light emitting element.

21 Claims, 13 Drawing Sheets

(56) References Cited

U.S. PATENT DOCUMENTS

| | | | |
|---|---|---|---|
| 11,056,650 B2 | 7/2021 | Kang et al. | |
| 2021/0043863 A1 | 2/2021 | Jung | |
| 2022/0376180 A1* | 11/2022 | Steiger | H10K 50/115 |

FOREIGN PATENT DOCUMENTS

| | | |
|---|---|---|
| KR | 10-1740429 B1 | 5/2017 |
| KR | 10-2019-0029193 A | 3/2019 |
| KR | 10-2019-0062442 A | 6/2019 |
| KR | 10-2019-0106819 A | 9/2019 |
| KR | 20190112632 A | 10/2019 |
| KR | 20190117890 A | 10/2019 |
| KR | 10-2021-0018567 A | 2/2021 |

OTHER PUBLICATIONS

Brown, Patrick R. et al., "Energy Level Modification in Lead Sulfide Quantum Dot Thin Films through Ligand Exchange", ACS Nano, May 13, 2014, vol. 8, No. 6, American Chemical Society, pp. 5863-5872.

Chuang, Chai-Hao M. et al., "Improved performance and stability in quantum dot solar cells through band alignment engineering", Nature Materials, Aug. 2014, vol. 13, Macmillan Publishers Limited, pp. 796-801.

* cited by examiner

QUANTUM DOT COMPOSITION, LIGHT EMITTING ELEMENT, AND METHOD FOR MANUFACTURING THE SAME

CROSS-REFERENCE TO RELATED APPLICATION

This application claims priority to and the benefit of Korean Patent Application No. 10-2020-0066720, filed on Jun. 2, 2020, the entire content of which is hereby incorporated by reference.

BACKGROUND

One or more aspects of embodiments of the present disclosure herein relate to a quantum dot composition, a light emitting element including an emission layer formed with the quantum dot composition, and a method for manufacturing the same.

Various display devices used for multimedia devices such as a television set, a mobile phone, a tablet computer, a navigation system, and/or a game console are being developed. In such display devices, a d self-luminescent display element is used, which accomplishes display of images by causing an organic compound-containing light emitting material to emit light.

In addition, development of a light emitting element using quantum dots as a light emitting material is underway as an effort to enhance the color reproducibility of display devices, and there is a demand (or desire) for increasing the luminous efficiency and service life of a light emitting element using quantum dots.

SUMMARY

One or more aspects of embodiments of the present disclosure are directed towards a quantum dot composition having improved dispersibility.

One or more aspects of embodiments of the present disclosure are also directed toward a light emitting element having improved luminous efficiency by including an emission layer having a plurality of quantum dots that are substantially evenly distributed and are close to each other.

One or more aspects of embodiments of the present disclosure further provide a method for manufacturing a light emitting element, including a method for forming an emission layer having improved luminous efficiency, by removing a ligand bonded to a quantum dot.

One or more embodiments of the present disclosure provides a quantum dot composition including a quantum dot having a surface to which a ligand is bonded, and a photoacid generator.

The ligand may include a head portion bonded to the surface of the quantum dot, and a tail portion containing at least one radical reactive group.

The radical reactive group may be a carbonyl group, an ester group, an ether group, a peroxy group, an azo group, a carbamate group, a thiocarbamate group, a carbonate group, or a xanthate group.

The ligand may be a monodentate ligand or a bidentate ligand.

The head portion may include a thiol group, a dithio acid group, a phosphine group, a catechol group, an amine group, or a carboxylic acid group.

The head portion may further include an alkyl group having 1 to 5 carbon atoms.

The tail portion may be represented by at least one among Formula 1-1 to Formula 1-11 below:

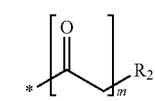
[Formula 1-1]

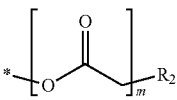
[Formula 1-2]

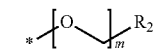
[Formula 1-3]

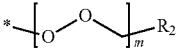
[Formula 1-4]

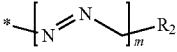
[Formula 1-5]

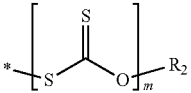
[Formula 1-6]

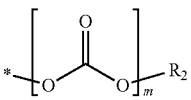
[Formula 1-7]

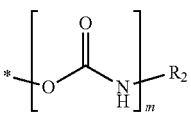
[Formula 1-8]

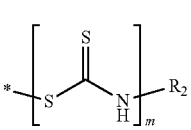
[Formula 1-9]

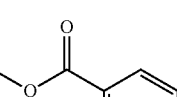
[Formula 1-10]

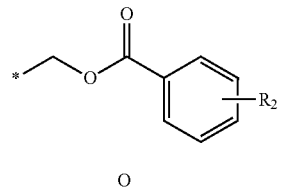
[Formula 1-11]

In Formulae 1-1 to 1-11, $R_2$ is an alkyl group having 1 to 20 carbon atoms, and m is an integer of 1 to 5.

The photoacid generator may be included in an amount of about 0.1 wt % to about 1 wt % with respect to a total amount of the quantum dot having the ligand bonded to the surface thereof.

The quantum dot composition may further include an organic solvent, and the quantum dots may be dispersed in the organic solvent.

The quantum dot having the ligand bonded to the surface thereof may be included in an amount of about 0.5 wt % to about 10 wt % based on a total amount of the quantum dot composition.

The quantum dot may be a semiconductor nanocrystal including a core and a shell around the core.

In one or more embodiments of the present disclosure, a light emitting element includes a first electrode, a hole transport region disposed on the first electrode, an emission layer disposed on the hole transport region, an electron transport region disposed on the emission layer, and a second electrode disposed on the electron transport region, wherein the emission layer includes a quantum dot having a surface to which a hydrophilic group is bonded.

The emission layer may further include residues containing a radical reactive group.

The residues may include a compound represented by at least one among Formula 2-1 to Formula 2-11 below:

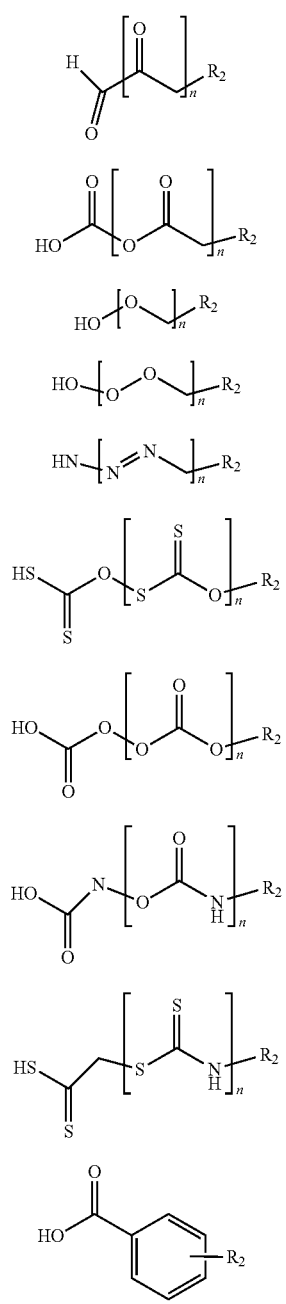

[Formula 2-1]
[Formula 2-2]
[Formula 2-3]
[Formula 2-4]
[Formula 2-5]
[Formula 2-6]
[Formula 2-7]
[Formula 2-8]
[Formula 2-9]
[Formula 2-10]

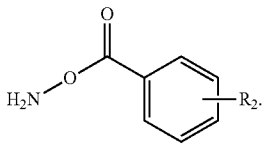

[Formula 2-11]

In Formulae 2-1 to 2-11, $R_2$ is an alkyl group having 1 to 20 carbon atoms, and n is an integer of 0 to 4.

In one or more embodiments of the present disclosure, a method for manufacturing a light emitting element includes forming a hole transport region on a first electrode, forming an emission layer on the hole transport region, forming an electron transport region on the emission layer, and forming a second electrode on the electron transport region, wherein the forming of the emission layer includes preparing a quantum dot composition containing a quantum dot having a surface to which a ligand is bonded, and a photoacid generator, applying the quantum dot composition on the hole transport region to form a preliminary emission layer, and applying ultraviolet (UV) light to the preliminary emission layer.

The preparing of the quantum dot composition may be performed by dispersing the quantum dot having the ligand bonded to the surface thereof (e.g., the dispersed quantum dot may refer to a plurality of dispersed quantum dots and the dispersed quantum dots each having the ligand bonded to the surface thereof), and the photoacid generator, in an organic solvent.

The photoacid generator may be included in an amount of about 0.1 wt % to about 1 wt % with respect to a total amount of the quantum dot having the ligand bonded to the surface thereof.

The applying of the light may be performed by irradiating ultraviolet light with a light amount of about 10 100 mJ/cm² to about 100 mJ/cm².

The quantum dot may include a core and a shell around the core, and the ligand may include a hydrophilic group bonded to the surface of the quantum dot and a radical reactive group.

The hydrophilic group may be a thiol group, a dithio acid group, a phosphine group, a catechol group, an amine group, or a carboxylic acid group.

The ligand may further include an alkyl group having 1 to 5 carbon atoms, the alkyl group connecting the hydrophilic group and the radical reactive group.

The quantum dot having the ligand bonded to the surface thereof may be included in about 0.5 wt % to about 5 wt % based on a total amount of the quantum dot composition.

BRIEF DESCRIPTION OF THE FIGURES

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
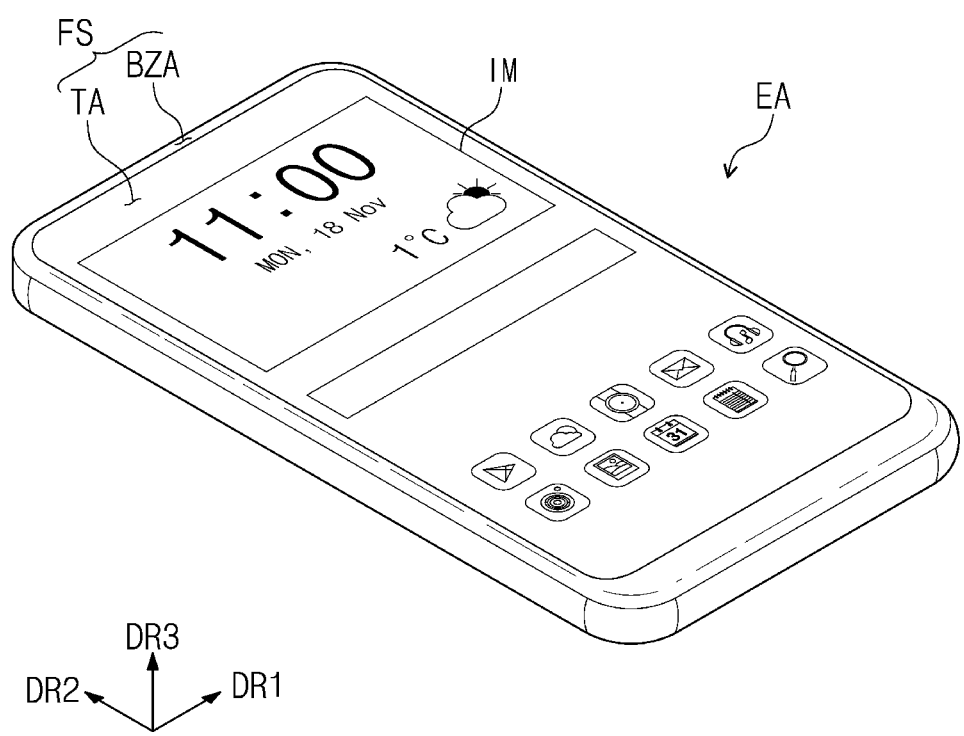
FIG. 1 is a combined perspective view of an electronic device of one or more embodiments.

The present disclosure may be modified in many alternate forms, and thus specific embodiments will be exemplified in the drawings and described in detail herein. It should be understood, however, that the present disclosure is not intended to be limited to the particular forms disclosed, but rather, is intended to cover all modifications, equivalents, and alternatives falling within the spirit and scope of the invention.

In the present description, when an element (or a region, a layer, a portion, etc.) is referred to as being "on," "connected to," or "coupled to" another element, it means that the element may be directly disposed on/connected to/coupled to the other element, or that a third element may be disposed therebetween.

Meanwhile, in the present disclosure, "directly disposed" means that there is no layer, film, region, plate and/or the like added between a portion of a layer, a film, a region, a plate and/or the like and other portions directly disposed thereon. For example, "directly disposed" may mean disposing two layers and/or two members without additional members, such as an adhesive member, therebetween.

Like reference numerals throughout the specification and drawings refer to like elements. Also, in the drawings, the thickness, the ratio, and the dimensions of elements are exaggerated for an effective description of technical contents.

The term "and/or," includes all combinations of one or more of which associated configurations may define. Further, the use of "may" when describing embodiments of the present disclosure refers to "one or more embodiments of the present disclosure."

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present disclosure. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by one of ordinary skill in the art to which the present disclosure pertains. It is also to be understood that terms defined in commonly used dictionaries should be interpreted as having meanings consistent with the meanings in the context of the related art, and are expressly defined herein unless they are interpreted in an ideal or overly formal sense.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Expressions such as "at least one of," "one of," and "selected from," when preceding a list of elements, modify the entire list of elements and do not modify the individual elements of the list.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Hereinafter, a quantum dot composition according to one or more embodiments of the present disclosure, a light emitting element, and a display device including the same will be described with reference to the accompanying drawings.

Figure 2:
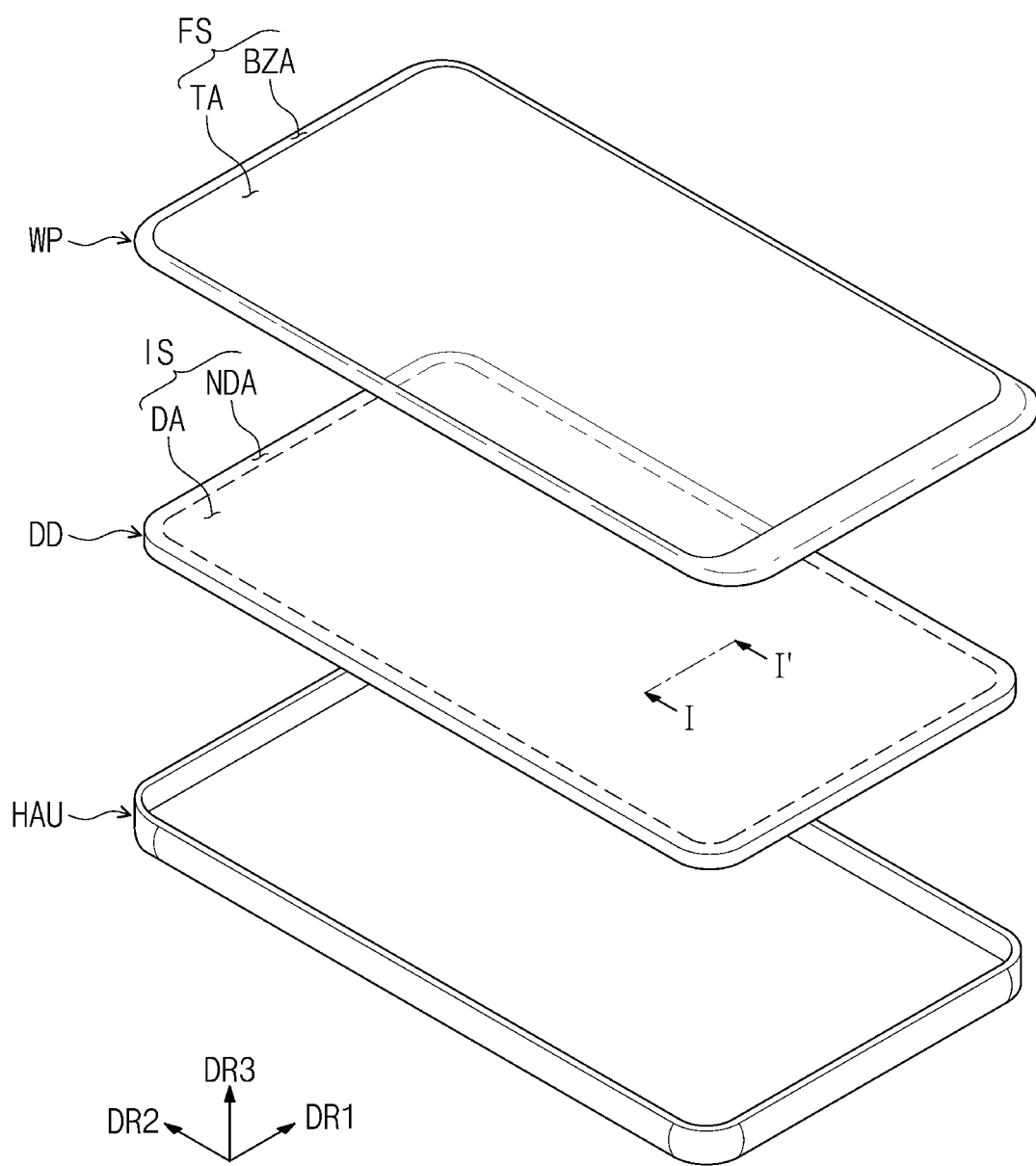
FIG. 2 is an exploded perspective view of an electronic device of one or more embodiments.
Figure 3:
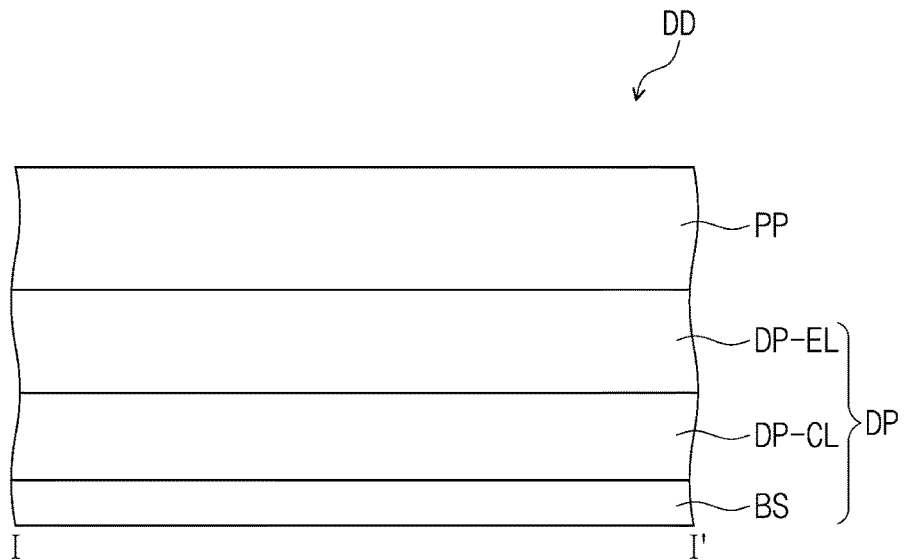
FIG. 3 is a cross-sectional view of a display device according to one or more embodiments, corresponding to line I-I' of FIG. 2.
Figure 4:
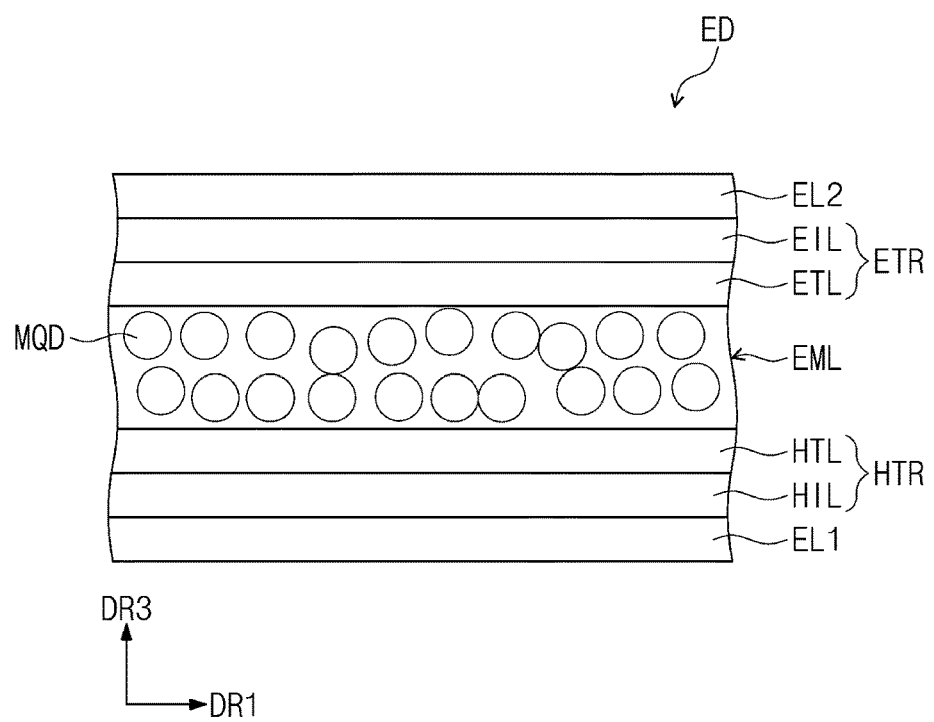
FIG. 4 is a cross-sectional view of a light emitting element of one or more embodiments.

FIG. 1 is a perspective view of an electronic device EA of one or more embodiments. FIG. 2 is an exploded perspective view of an electronic device EA of one or more embodiments. FIG. 3 is a cross-sectional view of a display device according to one or more embodiments, corresponding to line I-I' of FIG. 2. FIG. 4 is a cross-sectional view of a display device DD of one or more embodiments.

The electronic device EA may include a display device DD and a housing HAU. The display device DD may display an image IM through a display surface IS, and a user may view an image provided through a transmission area TA corresponding to a front surface FS of the electronic device EA. The image IM may include a still image as well as a dynamic image. FIG. 1 illustrates that the front surface FS is parallel to a plane defined by a first direction DR1 and a second direction DR2, crossing the first direction DR1. However, this is presented as an example, and in another embodiment, the front surface FS of the electronic device EA may have a curved shape.

Among the normal directions of front surface FS of the electronic device EA, that is, the thickness directions of the electronic device EA, a direction in which the image IM is displayed is indicated by a third direction DR3. A front surface (or an upper surface) and a rear surface (or a lower surface) of each member may be defined by the third direction DR3

A fourth direction DR4 (see FIG. 13) may be a direction between the first direction DR1 and the second direction DR2. The fourth direction DR4 may be positioned on a plane parallel to the plane defined by the first direction DR1 and the second direction DR2. However, the directions indicated by the first to fourth directions DR1, DR2, DR3 and DR4 are relative concepts, and may thus be changed to other directions.

In one or more embodiments, the electronic device EA may include a foldable display device having a folding area and a non-folding area, and/or a bending display device having at least one bent portion.

The electronic device EA may include a display device DD and a housing HAU. In the electronic device EA, the front surface FS may correspond to a front surface of the display device DD, and may correspond to a front surface of a window WP. Accordingly, the like reference FS will indicate the front surface of the electronic device EA, the front surface of the display device DD, and/or the front surface of the window WP.

The housing HAU may accommodate the display device DD. The housing HAU may be disposed to cover the display device DD such that an upper surface, which is the display surface IS of the display device DD, is exposed. The housing HAU may cover a side surface and a bottom surface of the display device DD, and expose the overall upper surface. However, the embodiments of the present disclosure are not limited thereto, and the housing HAU may cover a part of the upper surface as well as the side and bottom surfaces of the display device DD.

In the electronic device EA of one or more embodiments, the window WP may include an optically transparent insulating material. The window WP may include a transmission area TA and a bezel area BZA. The front surface FS of the window WP including the transmission area TA and the bezel area BZA corresponds to the front surface FS of the electronic device EA.

In FIGS. 1 and 2, the transmission area TA is shown in a rectangular shape with vertices rounded. However, this is exemplarily illustrated, and the transmission area TA may have various suitable shapes and is not limited to any one embodiment.

The transmission area TA may be an optically transparent area. The bezel area BZA may be an area having a relatively lower light transmittance than the transmission area TA. The bezel area BZA may have a predetermined (or set) color.

The bezel area BZA may be adjacent to the transmission area TA and may surround the transmission area TA. The bezel area BZA may define the shape of the transmission area TA. However, the embodiments of the present disclosure are not limited to the one illustrated, and the bezel area BZA may be disposed adjacent only to one side of the transmission area TA, and a part thereof may be omitted.

The display device DD may be disposed under the window WP. In the present description, "below" may indicate a direction opposite to the direction in which the display device DD provides an image.

In one or more embodiments, the display device DD may be substantially configured to generate an image IM. The image IM generated in the display device DD is displayed on the display surface IS, and is viewed by a user through the transmission area TA from the outside. The display device DD includes a display area DA and a non-display area NDA. The display area DA may be an area activated according to electrical signals. The non-display area NDA may be an area covered by the bezel area BZA. The non-display area NDA is adjacent to the display area DA. The non-display area NDA may surround the display area DA.

Referring to FIG. 3, the display device DD may include a display panel DP and a light control layer PP disposed on the display panel DP. The display panel DP may include a display element layer DP-EL. The display element layer DP-EL includes a light emitting element ED.

The light control layer PP may be disposed on the display panel DP to control reflected light from the display panel DP due to external light. The light control layer PP may include, for example, a polarizing layer and/or a color filter layer.

In the display device DD of one or more embodiments, the display panel DP may be a light emitting display panel. For example, the display panel DP may be a quantum dot light emitting display panel including a quantum dot light emitting element. However, the embodiment of the present disclosure is not limited thereto.

The display panel DP may include a base substrate BS, a circuit layer DP-CL disposed on the base substrate BS, and a display element layer DP-EL disposed on the circuit layer DP-CL.

The base substrate BS may be a member providing a base surface on which the display element layer DP-EL is disposed. The base substrate BS may be a glass substrate, a metal substrate, a plastic substrate, etc. However, the embodiments of the present disclosure are not limited thereto, and the base substrate BS may be an inorganic layer, an organic layer, or a composite material layer (including an organic material and an inorganic material). The base substrate BS may be a flexible substrate that may be readily bent and/or folded.

In one or more embodiments, the circuit layer DP-CL may be disposed on the base substrate BS, and the circuit layer DP-CL may include a plurality of transistors. The transistors each may include a control electrode, an input electrode, and an output electrode. For example, the circuit layer DP-CL may include a switching transistor and a driving transistor to drive the light emitting element ED of the display element layer DP-EL.

FIG. 4 is a view showing a light emitting element ED according to one or more embodiments, and referring to FIG. 4, the light emitting element ED according to one or more embodiments includes a first electrode EL1, a second electrode EL2 facing the first electrode EL1, and a plurality of functional layers disposed between the first electrode EL1 and the second electrode EL2 and having an emission layer EML.

The plurality of functional layers may include a hole transport region HTR disposed between the first electrode EL1 and the emission layer EML, and an electron transport region ETR disposed between the emission layer EML and the second electrode EL2. In one or more embodiments, a capping layer may be further disposed on the second electrode EL2.

The hole transport region HTR and the electron transport region ETR each may include a plurality of sub functional layers. For example, the hole transport region HTR may include a hole injection layer HIL and a hole transport layer HTL as sub functional layers, and the electron transport region ETR may include an electron injection layer EIL and an electron transport layer ETL as sub functional layers. However, the embodiments of the present disclosure are not limited thereto, and the hole transport region HTR may further include an electron blocking layer as a sub functional layer, and the electron transport region ETR may further include a hole blocking layer as a sub functional layer.

In the light emitting element ED according to one or more embodiments, the first electrode EL1 has conductivity. The first electrode EL1 may be formed of a metal alloy or any suitable conductive compound. The first electrode EL1 may be an anode. The first electrode EL1 may be a pixel electrode.

In the light emitting element ED according to one or more embodiments, the first electrode EL1 may be a reflective electrode. However, the embodiments of the present disclosure are not limited thereto. For example, the first electrode EL1 may be a transmissive electrode, or a transflective electrode. When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (e.g., a mixture of Ag and Mg). In some embodiments, the first electrode EL1 may have a multi-layer structure including a reflective film or a transflective film formed of any of the materials described above as an example, and a transparent conductive film formed of indium tin oxide (ITO), indium zinc oxide (IZO), zinc oxide (ZnO), indium tin zinc oxide (ITZO), etc. For example, the first electrode EL1 may be a multi-layer metal film, and may have a stack structure of metal films of ITO/Ag/ITO.

The hole transport region HTR is provided on the first electrode EL1. The hole transport region HTR may include a hole injection layer HIL, a hole transport layer HTL, etc. In one or more embodiments, the hole transport region HTR may further include at least one of a hole buffer layer or an electron blocking layer EBL, in addition to the hole injection layer HIL and the hole transport layer HTL. The hole buffer layer may compensate a resonance distance according to the wavelength of light emitted from an emission layer EML, and may thus increase luminous efficiency. Any of the materials, which may be included in the hole transport region HTR, may be used as materials included in the hole buffer layer. The electron blocking layer is a layer that serves to prevent or reduce electrons from being injected from the electron transport region ETR to the hole transport region HTR.

The hole transport region HTR may have a single layer formed of (e.g., consisting of) a single material, a single layer formed of a plurality of different materials, or a multi-layer structure including a plurality of layers formed of a plurality of different materials. For example, the hole transport region HTR may have a single-layer structure formed of a plurality of different materials, or a structure in which a hole injection layer HIL/hole transport layer HTL, a hole injection layer HIL/hole transport layer HTL/hole buffer layer, a hole injection layer HIL/hole buffer layer, a hole transport layer HTL/hole buffer layer, or a hole injection layer HIL/hole transport layer HTL/electron blocking layer EBL are stacked in order from the first electrode EL1, but the embodiments are not limited thereto.

The hole transport region HTR may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method.

The hole injection layer HIL may include, for example, a phthalocyanine compound (such as copper phthalocyanine), N,N'-diphenyl-N,N'-bis-[4-(phenyl-m-tolyl-amino)-phenyl]-biphenyl-4,4'-diamine (DNTPD), 4,4',4"-[tris(3-methylphenyl)phenylamino]triphenylamine] (m-MTDATA), 4,4', 4"-tris(N,N-diphenylamino)triphenylamine (TDATA), 4,4', 4"-tris{N,-(2-naphthyl)-N-phenylamino)-triphenylamine (2-TNATA), poly(3,4-ethylenedioxythiophene)/poly(4-styrenesulfonate) (PEDOT/PSS), polyaniline/dodecylbenzene-sulfonic acid (PANI/DBSA), polyaniline/camphor sulfonic acid (PANI/CSA), polyaniline/poly(4-styrenesulfonate) (PANI/PSS), N,N'-di(naphthalene-I-yl)-N,N'-diphenyl-benzidine (NPD), triphenylamine-containing polyetherketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may include one or more suitable materials. The hole transport layer HTL may include, for example, carbazole-based derivatives (such as N-phenyl carbazole and/or polyvinyl carbazole), fluorine-based derivatives, N,N'-bis(3-methylphenyl)-N,N'-diphenyl-[1,1-biphenyl]-4,4'-diamine (TPD), triphenylamine-based derivatives (such as 4,4',4"-tris(N-carbazolyl) triphenylamine (TCTA)), N,N'-di(1-naphtalene-1-yl)-N,N'-diphenyl-benzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 1,3-bis (N-carbazolyl)benzene (mCP), etc.

The hole transport region HTR may have a thickness of about 5 nm to about 1,500 nm, for example, about 10 nm to about 500 nm. The hole injection layer HIL may have a thickness of, for example, about 3 nm to about 100 nm, and the hole transport layer HTL may have a thickness of, for example, about 3 nm to about 100 nm. For example, the electron blocking layer EBL may have a thickness of about 1 nm to about 100 nm. When the thicknesses of the hole transport region HTR, the hole injection layer HIL, the hole transport layer HTL, and the electron blocking layer EBL each independently satisfy the respective above-described ranges, satisfactory (or suitable) hole transporting properties may be obtained without a substantial increase in driving voltage.

An emission layer EML is provided on the hole transport region HTR. The emission layer EML includes a quantum dot MQD to which a plurality of hydrophilic groups are bonded. The quantum dot MQD to which the hydrophilic groups are bonded has a functional group, which is a hydrophilic group, bonded to a surface of the quantum dot, and may have modified surface properties. Hereinafter, the quantum dot MQD to which the hydrophilic groups are bonded is referred to as a surface-modified quantum dot MQD.

Surface-modified quantum dots MQD included in an emission layer EML may be stacked to form a layer. In FIG. 4, for example, the surface-modified quantum dots MQD having a circular cross-section are arranged to form two layers, but the embodiments are not limited thereto. For example, the arrangement of the surface-modified quantum dots MQD may vary according to the thickness of the emission layer EML, the shape of the quantum dot QD included in the emission layer EML, and the average diameter of the quantum dots QD. For example, in the emission layer EML, the surface-modified quantum dots MQD may be aligned to be adjacent to each other to form a single layer, or may be aligned to form a plurality of layers, such as two or three layers. The quantum dot composition and the surface-modified quantum dots MQD will be described in more detail hereinbelow.

In one or more embodiments, in the light emitting element ED, an emission layer EML may include a host and a dopant. In one or more embodiments, the emission layer EML may include a surface-modified quantum dot MQD as a dopant material. In addition, in one or more embodiments, the emission layer EML may further include a host material.

In the light emitting element ED of one or more embodiments, the emission layer EML may emit fluorescence. For example, the surface-modified quantum dot MQD may be used as a fluorescent dopant material.

In the light emitting element ED of one or more embodiments, an electron transport region ETR is provided on the emission layer EML. The electron transport region ETR may include at least one among a hole blocking layer, an electron transport layer ETL, and an electron injection layer EIL, but the embodiments of the present disclosure are not limited thereto.

The electron transport region ETR may have a single layer formed of (e.g., consisting of) a single material, a single layer formed of a plurality of different materials, or a multilayer structure including a plurality of layers formed of a plurality of different materials.

For example, the electron transport region ETR may have a single layer structure of an electron injection layer EIL or an electron transport layer ETL, and may have a single layer structure formed of an electron injection material and an electron transport material. In some embodiments, the electron transport region ETR may have a single layer structure formed of a plurality of different materials, or may have a structure in which an electron transport layer ETL/electron injection layer EIL, or a hole blocking layer/electron transport layer ETL/electron injection layer EIL are stacked in order from the emission layer EML, but is not limited thereto. The thickness of the electron transport region ETR may be, for example, from about 20 nm to about 150 nm.

The electron transport region ETR may be formed using one or more suitable methods such as a vacuum deposition method, a spin coating method, a cast method, a Langmuir-Blodgett (LB) method, an inkjet printing method, a laser printing method, a laser induced thermal imaging (LITI) method, etc.

When the electron transport region ETR includes the electron transport layer ETL, the electron transport region ETR may include an anthracene-based compound. However, the embodiments of the present disclosure are not limited thereto, and the electron transport region ETR may include, for example, tris(8-hydroxyquinolinato)aluminum (Alq$_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq$_2$), 9,10-di(naphthalene-2-yl)anthracene (ADN), or a mixture thereof. The thickness of the electron transport layer ETL may be from about 10 nm to about 100 nm, and may be, for example, from about 15 nm to about 50 nm. When the thickness of the electron transport layer ETL satisfies the above-described ranges, satisfactory (or suitable) electron transport properties may be obtained without a substantial increase in driving voltage.

When the electron transport region ETR includes the electron injection layer EIL, the electron transport region ETR may include a halogenated metal (such as LiF, NaCl, CsF, Yb, RbCl, and/or RbI), a lanthanide metal (such as Yb), a metal oxide (such as Li$_2$O and/or BaO), and/or lithium quinolate (LiQ), but the embodiments of the present disclosure are limited thereto. The electron injection layer EIL may also be formed of a mixture material of an electron transport material and an insulating organo-metal salt. The organo-metal salt may be selected from, for example, metal acetates, metal benzoates, metal acetoacetates, metal acetylacetonates, and metal stearates. The thickness of the electron injection layer EIL may be about 0.1 nm to about 10 nm, for example, about 0.3 nm to about 9 nm. When the thickness of the electron injection layer EIL satisfies the above-described ranges, satisfactory (or suitable) electron injection properties may be obtained without a substantial increase in driving voltage.

The electron transport region ETR may include a hole blocking layer as described above. The hole blocking layer may include, for example, at least one of 2,9-dimethyl-4,7-diphenyl-1,10-phenanthroline (BCP) or 4,7-diphenyl-1,10-phenanthroline (Bphen), but is not limited thereto.

The second electrode EL2 is provided on the electron transport region ETR. The second electrode EL2 may be a common electrode and/or a cathode. The second electrode EL2 may be a transmissive electrode, a transflective electrode or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, a compound thereof (e.g., AgYb, AgMg and/or MgAg compounds, according to content, etc.), or a mixture thereof (e.g., a mixture of Ag and Mg, a mixture of Ag and Yb, etc.). For example, the second electrode EL2 may include AgMg, AgYb, or MgAg. In one or more embodiments, the second electrode EL2 may have a multilayer structure including a reflective film or a transflective film formed of any of the above-described materials, and a transparent conductive film formed of indium tin oxide (ITO), indium zinc oxide (IZO), zinc oxide (ZnO), indium tin zinc oxide (ITZO), etc.

In one or more embodiments, the second electrode EL2 may be connected with an auxiliary electrode. When the second electrode EL2 is connected with the auxiliary electrode, the resistance of the second electrode EL2 may decrease.

Figure 5:
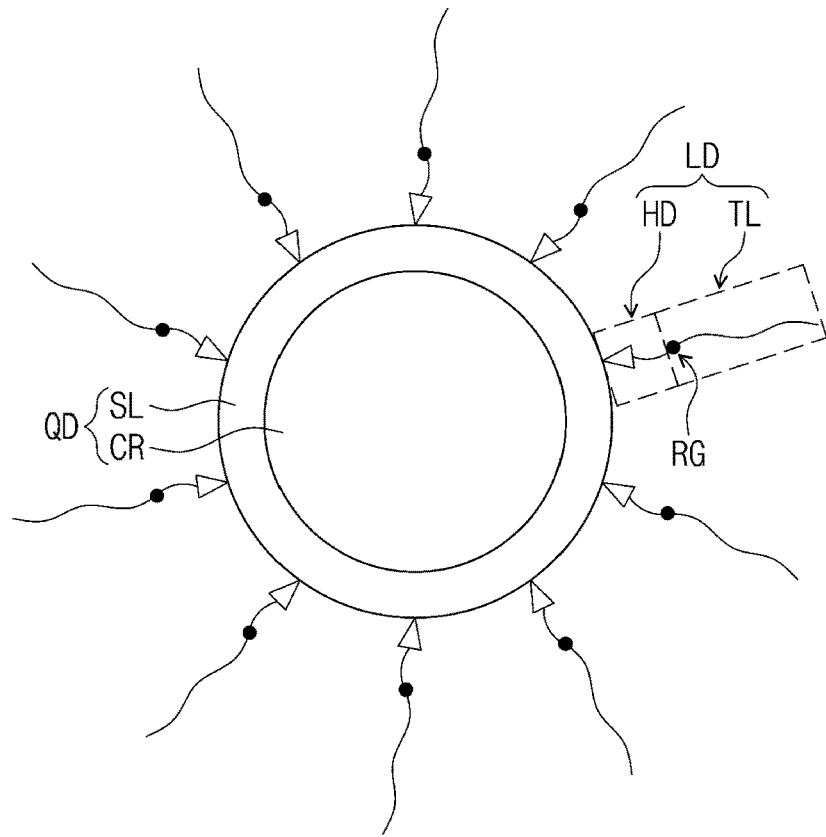
FIG. 5 is a schematic view of a surface-modified quantum dot having a ligand bonded to the surface thereof of one or more embodiments.
Figure 6:
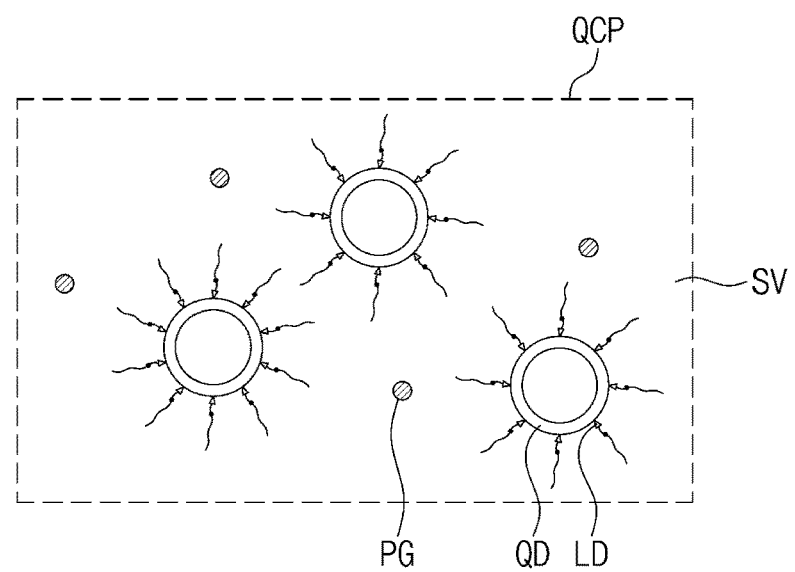
FIG. 6 is a cross-sectional view illustrating a quantum dot composition according to one or more embodiments.

FIG. 5 is a schematic view of a quantum dot and a ligand included in a quantum dot composition of one or more embodiments. FIG. 6 is a view illustrating a quantum dot composition according to one or more embodiments.

A quantum dot composition QCP according to one or more embodiments includes a quantum dot QD, a ligand LD bonded to a surface of the quantum dot, and a photoacid generator. The quantum dot QD may have a ligand LD bonded to the surface thereof. For example, the quantum dot QD may include a core CR and a shell SL, and the ligand LD may be bonded to the shell SL.

FIG. 5 schematically shows a quantum dot QD having a ligand LD bonded to the surface thereof. The quantum dot QD has a ligand LD bonded to the surface thereof in order to keep charge injection properties while improving dispersibility and capping properties. The ligand LD bonded to the quantum dot QD is partially removed when an emission layer is formed, thereby preventing or reducing degradation of charge injection properties.

The quantum dot QD of one or more embodiments may be a semiconductor nanocrystal that may be selected from a Group II-VI compound, a Group III-V compound, a Group IV-VI compound, a Group IV element, a Group IV compound, and a combination thereof.

The Group II-VI compound may be selected from the group consisting of a binary compound selected from the group consisting of CdSe, CdTe, ZnS, ZnSe, ZnTe, ZnO, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$ and/or $In_2Se_3$; a ternary compound such as $InGaS_3$ and/or $InGaSe_3$; or any combination thereof.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP, and a mixture thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V semiconductor compound may further include a Group II metal (e.g., InZnP, etc.)

The Group IV-VI compound may be selected from the group consisting of a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

The Group I-III-VI semiconductor compound may include a ternary compound such as AgInS, $AgInS_2$, CuInS, $CuInS_2$, $CuGaO_2$, $AgGaO_2$, $AgAlO_2$, or any combination thereof.

In some embodiments, a binary compound, a ternary compound, or a quaternary compound may be present in a particle in a uniform concentration distribution, or may be present in the same particle in a partially different concentration distribution. In addition, a core/shell structure in which one quantum dot surrounds another quantum dot may be present. An interface between a core and a shell may have a concentration gradient in which the concentration of an element present in a shell becomes lower toward the center of the structure.

In some embodiments, a quantum dot QD may have the core/shell structure including a core CR having any of the above-described nano-crystals, and a shell SL surrounding the core CR. The shell SL of the quantum dot QD having the core/shell structure may serve as a protection layer to prevent or reduce the chemical deformation of the core CR so as to maintain semiconductor properties, and/or a charging layer to impart electrophoresis properties to the quantum dot QD. The shell SL may be a single layer or multiple layers. An interface between the core CR and the shell SL may have a concentration gradient in which the concentration of an element (and/or compound) present in the shell SL becomes lower toward the center. An example of the shell SL of the quantum dot QD having the core-shell structure may be a metal oxide, a non-metal oxide, a semiconductor compound, or a combination thereof.

For example, the metal oxide or the non-metal oxide may each independently be a binary compound (such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO), or a ternary compound (such as $MgAl_2O_4$, $CoFe_2O_4$, $NiFe_2O_4$, and/or $CoMn_2O_4$), but the embodiments of the present disclosure are not limited thereto.

In one or more embodiments, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the embodiments of the present disclosure are not limited thereto.

A quantum dot QD may have a full width of half maximum (FWHM) of a light emission wavelength spectrum of about 45 nm or less, for example, about 40 nm or less, or about 30 nm or less, and color purity and/or color reproducibility may be enhanced in the above range. In addition, light emitted through such a quantum dot is emitted in all directions, and thus a wide viewing angle may be improved.

The form of a quantum dot QD is not particularly limited as long as it is a form commonly used in the art, and for example, a quantum dot in the form of spherical, pyramidal, multi-arm, and/or cubic nanoparticles, nanotubes, nanowires, nanofibers, nanoparticles, etc. may be used.

A quantum dot QD may control the color of emitted light according to the particle size thereof, and thus the quantum dot QD may have various light emission colors such as blue, red, green, etc. The smaller the particle size of the quantum dot QD becomes, the shorter the wavelength region of light may be emitted. For example, in the quantum dot QD having the same core, the particle size of a quantum dot emitting green light may be smaller than the particle size of a quantum dot emitting red light. In addition, in the quantum dot QD having the same core, the particle size of a quantum dot emitting blue light may be smaller than the particle size of a quantum dot emitting green light. However, the embodiments of the present disclosure are not limited thereto, and even in the quantum dot QD having the same core, the particle size may be adjusted according to materials forming the quantum dot and/or thickness of a shell.

When a quantum dot QD has various light emission colors such as blue, red, green, etc., the quantum dots QD having different light emission colors may have different core materials.

As described above, the quantum dot QD may include a core CR and a shell SL surrounding the core CR. However, the embodiments of the present disclosure are not limited thereto, and the quantum dot QD may have a single-layer structure or may have a plurality of shells.

A ligand LD includes a head portion HD bonded to a surface of the quantum dot QD, and a tail portion TL that is exposed to the outside and may be removed through a radical reaction.

The head portion HD of the ligand LD is bonded to the surface of the quantum dot QD to form a surface-modified quantum dot MQD, and the head portion HD is not removed even after the radical reaction. For example, when the quantum dot QD includes the core CR and the shell SL, the head portion HD may be bonded to the shell SL. For example, when the head portion HD includes a thiol group, and the shell SL includes a metal ion Zn, the thiol group of the head portion HD is bonded to Zn to allow the bonding of the ligand LD to the quantum dot QD.

The head portion HD may include a functional group to bind to the surface of the quantum dot QD. The functional group to bind to the surface of the quantum dot QD may be a hydrophilic group, and may include, for example, a thiol group, a dithio acid group, a phosphine group, a catechol group, an amine group, and/or a carboxylic acid group. However, the embodiment of the present disclosure is not limited thereto.

When the head portion HD includes a single functional group to bind to the surface of the quantum dot QD, the ligand LD may be a monodentate ligand. When the head portion HD includes two functional groups to bind to the surface of the quantum dot QD, the ligand LD may be a bidentate ligand. The head portion HD may include a functional group to bind to the surface of a shell SL of the quantum dot QD.

The head portion HD may further include an alkyl group having 1 to 5 carbon atoms. The head part HD further includes an alkyl group having 1 to 5 carbon atoms, or 1 to 3 carbon atoms, to aid in stability of the quantum dot QD, without inhibiting electron injection.

The tail portion TL of the ligand LD is a portion removed in the manufacturing of an emission layer EML and includes at least one radical reactive group RG. The radical reactive group RG is not particularly limited as long as it is a functional group capable of reacting with a photoacid generator PG. For example, the radical reactive group RG may be a carbonyl group, an ester group, an ether group, a peroxy group, an azo group, a carbamate group, a thiocarbamate group, a carbonate group, or a xanthate group.

The tail portion TL of the ligand LD may further include an alkyl group having 2 to 20 carbon atoms. The tail portion TL further includes an alkyl group to control the length of the ligand LD, so as to perform a function of controlling the dispersibility of the quantum dots QD in the quantum dot composition QCP. When the number of carbon atoms of the alkyl group of the tail portion TL is less than 2, the distance between adjacent quantum dots QD may be too close, and when the number of carbon atoms is greater than 20, the distance between the adjacent quantum dots QD may be too far.

In one or more embodiments, the tail portion TL may be represented by any one among Formula 1-1 to Formula 1-11 below:

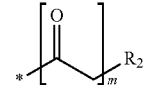

[Formula 1-1]

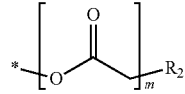

[Formula 1-2]

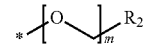

[Formula 1-3]

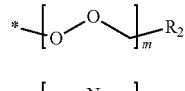

[Formula 1-4]

[Formula 1-5]

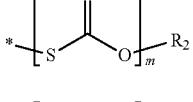

[Formula 1-6]

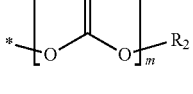

[Formula 1-7]

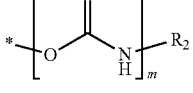

[Formula 1-8]

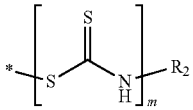

[Formula 1-9]

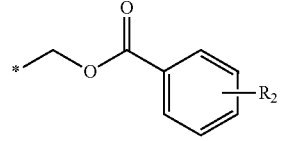

[Formula 1-10]

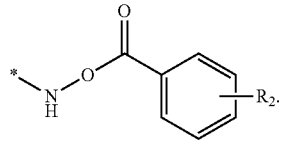

[Formula 1-11]

In Formulae 1-1 to 1-11 above, $R_2$ is an alkyl group having 1 to 20 carbon atoms, and m is an integer of 1 to 5. In some embodiments, $R_2$ may be an alkyl group having 2 to 20 carbon atoms.

Meanwhile, "*⎯⎯⎯" in the present description indicates a position to be connected (e.g., a binding site).

In order to effectively (or suitably) disperse the quantum dot QD in the quantum dot composition QCP, the quantum dot QD having a ligand LD bonded to the surface thereof (e.g., the dispersed quantum dot OD may refer to a plurality of dispersed quantum dots and the dispersed quantum dots each having the ligand LD bonded to the surface thereof) may be included in an amount of about 0.5 wt % or greater, or about 5 wt % or greater, and about 0.6 wt % or less, or about 4 wt % or less, with respect to the total amount of the quantum dot composition QCP.

The quantum dot composition QCP according to one or more embodiments includes a photoacid generator PG. The photoacid generator PG is not particularly limited, and may be, for example, a nonionic photoacid generator. The quantum dot composition QCP may include a non-polar organic solvent for the dispersibility of the quantum dot QD, and when the photoacid generator is nonionic, the dispersibility may be further improved, thereby allowing an efficient (or suitable) reaction when an emission layer is formed. For example, the photoacid generator PG may include sulfonate. The photoacid generator PG may be used alone or in combination of two or more. The photoacid generator PG may be included in an amount of about 0.1 mass % to about 1 mass %, and about 0.2 mass % to about 0.7 mass %, with respect to the total amount of the quantum dot QD to which a ligand is bonded, to efficiently (or suitably) perform and accelerate the reaction.

The quantum dot composition QCP may include an organic solvent SV. For example, the organic solvent SV may include hexane, toluene, chloroform, dimethyl sulfoxide, octane, xylene, hexadecane, cyclohexylbenzene, triethylene glycol monobutyl ether, dimethylformamide, decane, dodecane hexadecene, cyclohexylbenzene, tetrahydronaphthalene, ethylnaphthalene, ethylbiphenyl, isopropylnaphthalene, diisopropylnaphthalene, diisopropylbiphenyl, xylene, isopropylbenzene, pentylbenzene, diisopropylbenzene, decahydronaphthalene, phenylnaphthalene, cyclohexyldecahydronaphthalene, decylbenzene, dodecylbenzene, octylbenzene, cyclohexane, cyclopentane, cycloheptane, etc. However, the embodiments of the present disclosure are not limited thereto.

Figure 7:
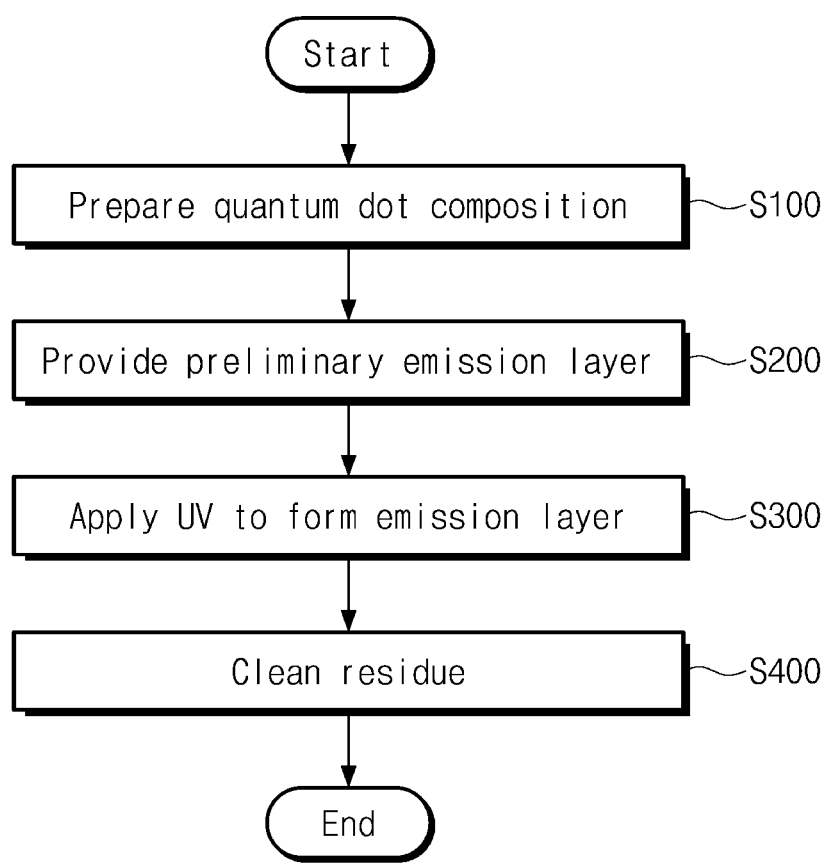
FIG. 7 is a flowchart showing a method for manufacturing a light emitting element according to one or more embodiments.
Figure 8:
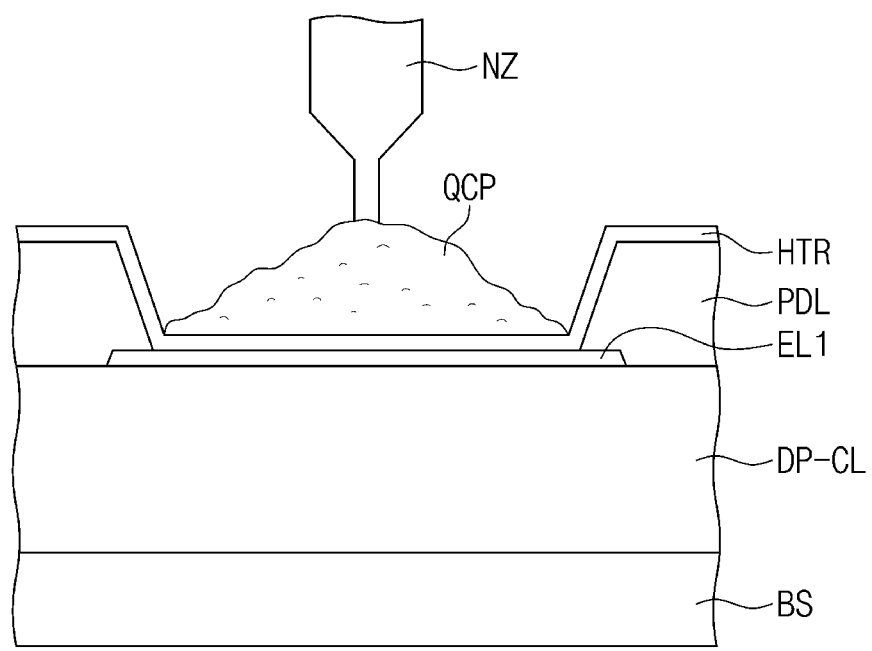
FIG. 8 is a cross-sectional view schematically showing an act of forming a preliminary emission layer according to one or more embodiments.
Figure 9:
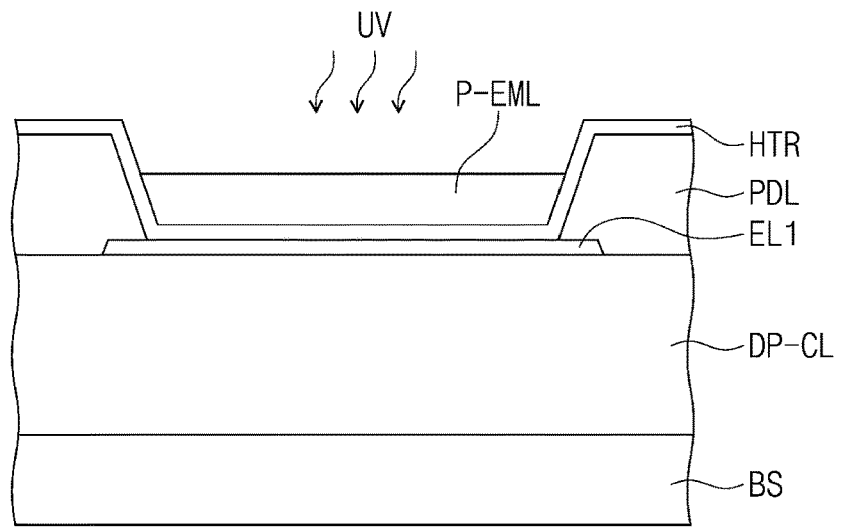
FIG. 9 is a view schematically showing an act of forming an emission layer according to one or more embodiments.
Figure 10:
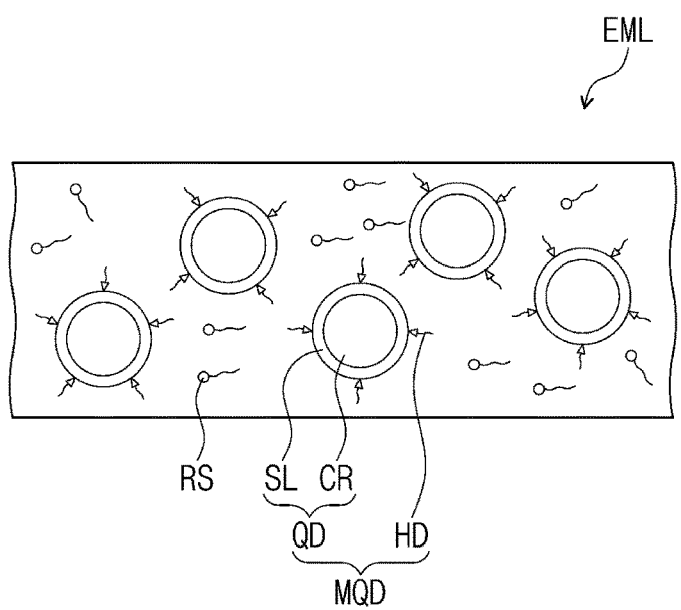
FIG. 10 is a cross-sectional view of an emission layer according to one or more embodiments.
Figure 11:
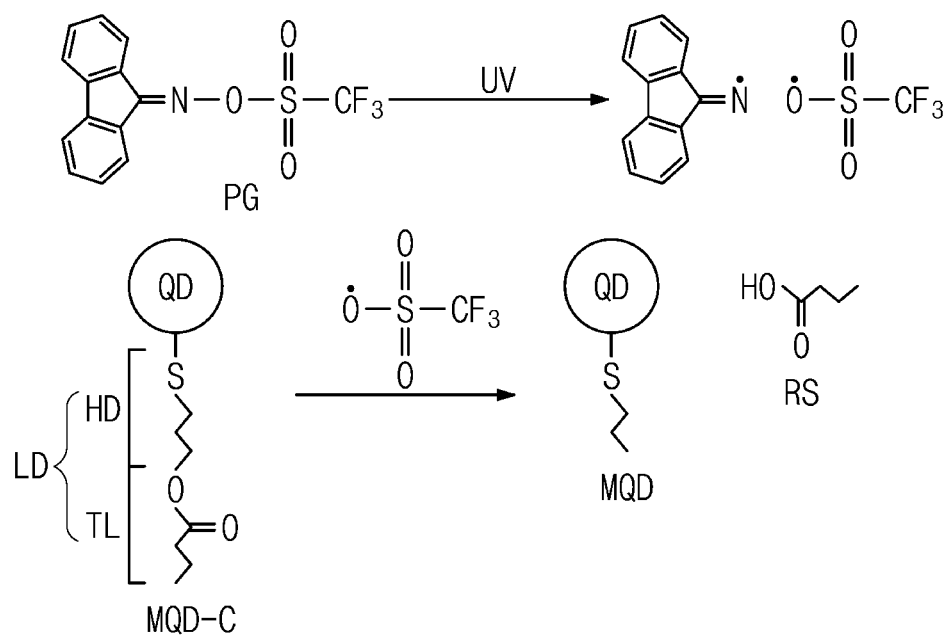
FIG. 11 is a view showing reaction performed in a quantum dot composition according to one or more embodiments.

FIG. 7 is a flowchart showing a method for manufacturing a light emitting element according to one or more embodiments. FIGS. 8 and 9 schematically show a part of a method for manufacturing a light emitting element according to one or more embodiments. FIG. 10 is a cross-sectional view showing an emission layer manufactured according to one or more embodiments. FIG. 11 is a view showing reaction between a radical initiator and a quantum dot to which a ligand is bonded in a quantum dot composition according to one or more embodiments.

A method for manufacturing a light emitting element includes forming a hole transport region on a first electrode, forming an emission layer on the hole transport region, forming an electron transport region on the emission layer, and forming a second electrode on the electron transport region.

Referring to FIG. 7, the forming of an emission layer of a light emitting element according to one or more embodiments includes preparing a quantum dot composition (S100), providing a preliminary emission layer (S200), and emitting UV light to form an emission layer (S300).

In the preparing of a quantum dot composition (S100), a quantum dot QD having a ligand bonded to the surface thereof and a photoacid generator PG are dispersed in an organic solvent SV. The quantum dot QD may have the ligand LD bonded to the surface thereof to increase dispersibility in the organic solvent SV.

FIG. 8 schematically shows an act of providing a preliminary emission layer (S200) in a method for manufacturing a light emitting element according to one or more embodiments. The providing of the preliminary emission layer (S200) is performed by applying a quantum dot composition QCP on a hole transport region HTR.

The method for applying the quantum dot composition QCP on the hole transport region HTR is not particularly limited, and may be a spin coating method, a cast method, a LB method (Langmuir-Blodgett), an inkjet printing method, a laser printing method, a laser thermal transfer method (LITI), etc. FIG. 8 illustrates that the quantum dot composition QCP is applied between portions of a pixel defining film PDL through a nozzle NZ, but the embodiments of the present disclosure are not limited thereto.

The thickness of an emission layer EML is not particularly limited, but may be, for example, about 5 nm to about 100 nm, or about 10 nm to about 50 nm FIG. 9 is a view schematically showing an act of providing UV light to form an emission layer (S200) in a method for manufacturing a light emitting element according to one or more embodiments. According to one or more embodiments, the providing of UV light to a preliminary emission layer P-EML may be performed by emitting light having a wavelength of 400 nm or less with a light amount of about 10 mJ/cm$^2$ to about 100 mJ/cm$^2$ to the preliminary emission layer P-EML, to induce reaction in which a part of the ligand LD bonded to the quantum dot QD is removed, and to cure the preliminary emission layer P-EML. When UV light is provided to the preliminary emission layer P-EML, the photoacid generator PG absorbs light and acts as a radical initiator. The generated radical reacts with a radical reactive group of a tail portion TL of the ligand LD to break the bond between the tail portion TL and the head portion HD.

FIG. 10 is a view showing an emission layer EML manufactured according to one or more embodiments. In the providing of UV light to the preliminary emission layer P-EML, the ligand LD reacts with a photoacid generator PG to form an emission layer EML in the form of a surface-modified quantum dot MQD, as a part of the ligand LD is removed. The removal of the part of the ligand LD bonded to the quantum dot QD makes the distance between adjacent quantum dots QD closer. Residues RS generated from the reaction between the ligand LD and the photoacid generator PG may be removed in the cleaning, or some may remain in the emission layer EML.

In one or more embodiments, some of the residues may be the tail portion TL, for example, may be represented by at least one among Formula 2-1 to Formula 2-11 below.

[Formula 2-1]

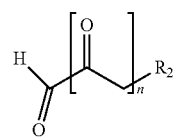

[Formula 2-2]

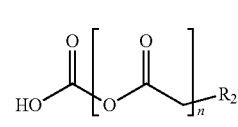

[Formula 2-3]

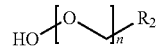

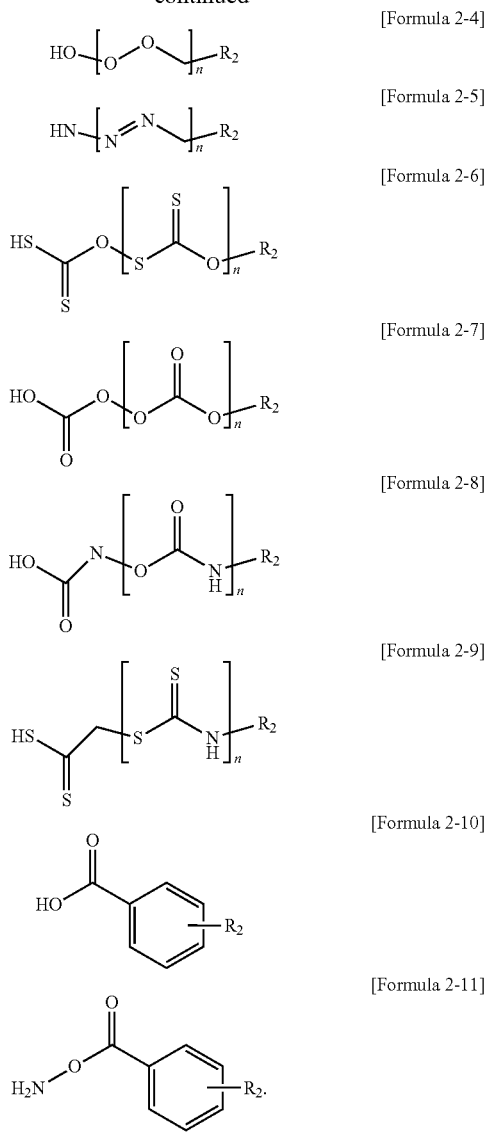

In Formulae 2-1 to 2-11, $R_2$ is an alkyl group having 1 to 20 carbon atoms, and n is an integer of 0 to 4. In some embodiments, $R_2$ may be an alkyl group having 2 to 20 carbon atoms.

FIG. 11 briefly illustrates a reaction occurring in a quantum dot composition according to one or more embodiments. When UV light is emitted onto a preliminary emission layer P-EML, a photoacid generator PG absorbs light to function as a radical initiator. The generated radical reacts with a radical reactive group of a tail portion TL of a ligand LD, to break the bond between the tail portion TL and the head portion HD. In FIG. 11, a ligand LD having an ester group as a radical reactive group is exemplarily illustrated. The radical reaction generates a surface-modified quantum dot MQD, in which a part of the ligand LD is removed, and the tail portion TL and the decomposed photoacid generator are present as residues RS.

After the forming of the emission layer (S300) in the method for manufacturing the light emitting element according to one or more embodiments, an act of cleaning residues RS (S400) may be further included. The cleaning of the residues may be performed by removing the residues RS and an organic solvent SV through a vacuum process, or applying a solvent capable of dissolving the residues on an upper part of the emission layer, and then applying heat and the vacuum process to remove the residues and the organic solvent SV.

Figure 12A:
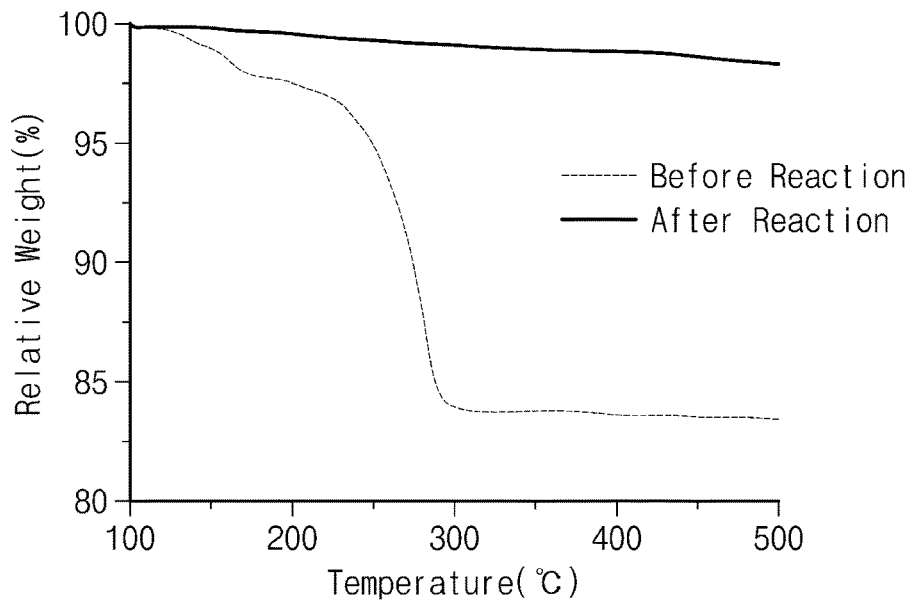
FIGS. 12A and 12B are graphs showing analysis results of quantum dot compositions before and after reaction, respectively.
Figure 12B:
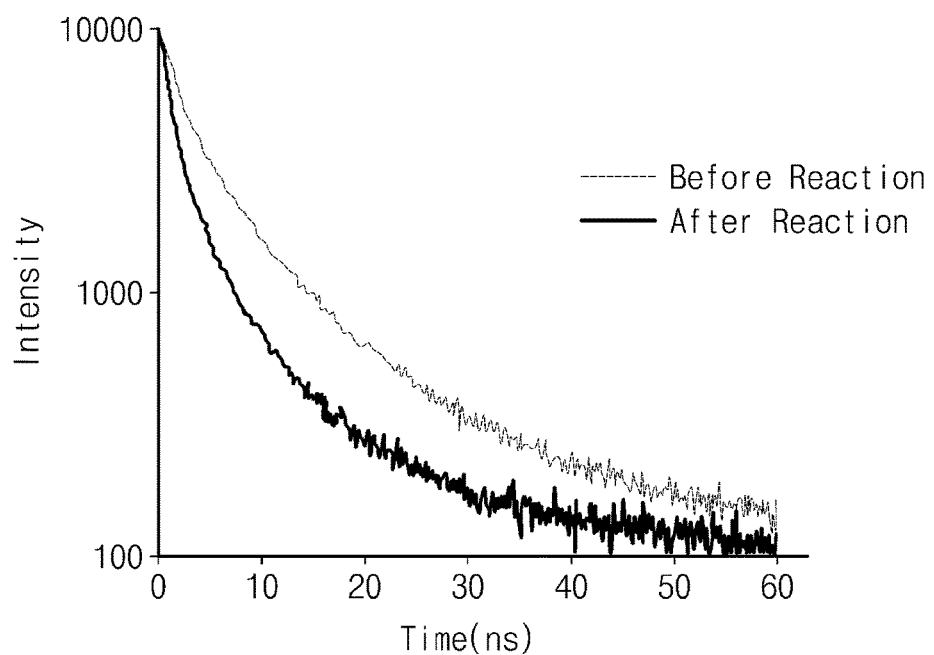

FIGS. 12A and 12B show results of comparing a quantum dot composition before and after reaction of FIG. 11. The "pre-reaction" (Before Reaction) graph indicated by the dotted line in FIGS. 12A and 12B shows analysis results of the quantum dot composition before light irradiation. That is, the "pre-reaction" graph shows analysis results of a quantum dot to which a tail portion of a ligand is still directly bonded. The "post-reaction" (After Reaction) graph indicated by the solid line in FIGS. 12A and 12B shows analysis results of a surface-modified quantum dot in which a tail portion of a ligand has been removed through light irradiation.

FIG. 12A shows thermal analysis results of a quantum dot composition before and after reaction of FIG. 11. The thermal analysis results of the quantum dot composition were obtained by measuring relative changes in sample weight measured using thermogravimetric analysis (TGA).

Referring to FIG. 12A, it is seen from the graph of "pre-reaction" (Before Reaction graph) that the relative weight (%) was significantly reduced at a temperature of 250° C. or higher. Without being bound by any particular theory, this suggests that the elimination of the tail portion of the ligand has contributed to the results. For example, in the "pre-reaction" quantum dot, the ligand including both the head portion and the tail portion is bonded to the surface of the quantum dot, and such ligand is dissolved at a high temperature of 250° C. or higher so as to have a significantly reduced weight. In comparison, the graph of "post-reaction" quantum dot shows little decrease in weight even at 300° C. or higher, which suggests, without being bound by any particular theory, that the elimination of most part of the tail portion due to the radical reaction has contributed to the results (e.g., with most of the tail portion removed, the ligand that remains on the surface of the quantum dot is not as easily dissolved). The quantum dot composition of one or more embodiments includes a photoacid generator to effectively (or suitably) remove the tail portion of the ligand bonded to the surface of the quantum dot.

FIG. 12B shows analysis results of electron transition time according to the reaction of FIG. 11. The electronic transition time analysis was performed by measuring relative changes in intensity measured using Time Resolved Photoluminescence.

In the present disclosure, the electron transition time refers to the time it takes for the electrons to turn from an excited state into a ground state, and the lower the intensity during the time, the shorter the electron transition time. Referring to FIG. 12B, it is seen that the "pre-reaction" (Before Reaction) graph has a higher intensity over the entire time period than the "post-reaction" (After Reaction) graph. Without being bound by any particular theory, it is believed that the "pre-reaction" quantum dot has a longer electron transition time than the "post-reaction" quantum dot. Because the electron transition time becomes shorter when quantum dots get closer, the "post-reaction" quantum dot is believed to be relatively closer to other quantum dots than the "pre-reaction" quantum dot. According to one or more embodiments, the quantum dot composition of one or more embodiments includes a photoacid generator to effectively (or suitably) remove the tail portion of the ligand bonded to the surface of the quantum dot when applied to a light emitting element, and thus may reduce the distance between the quantum dots in the resulting composition, thereby increasing charge transfer to improve luminous efficiency.

Figure 13A:
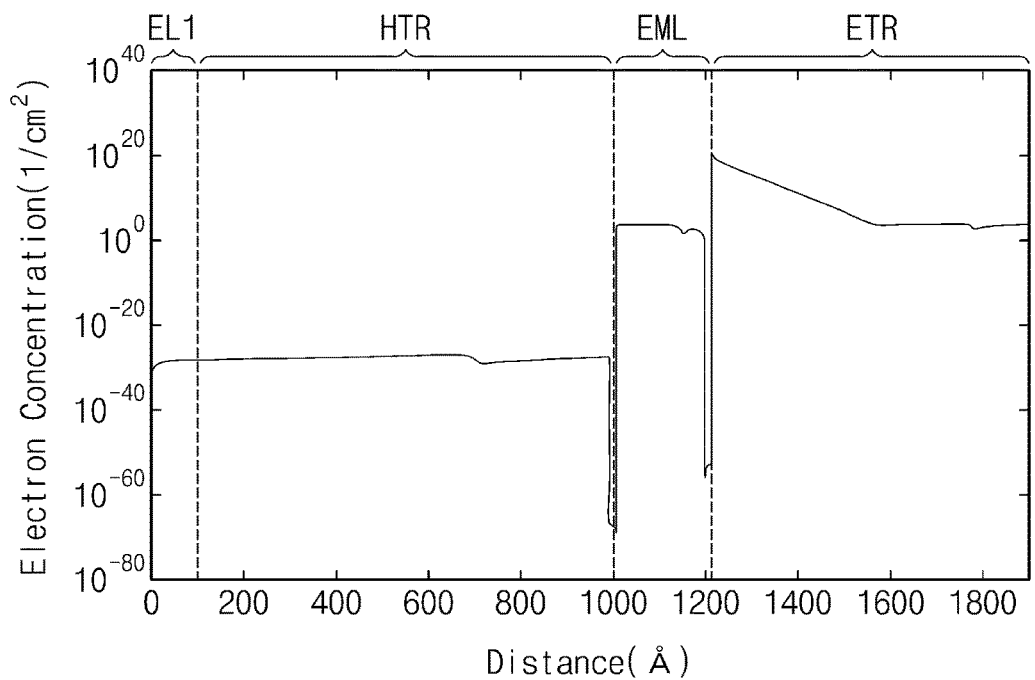
FIG. 13A is a graph showing simulation results of electron concentrations for each layer of a light emitting element according to Comparative Example.
Figure 13B:
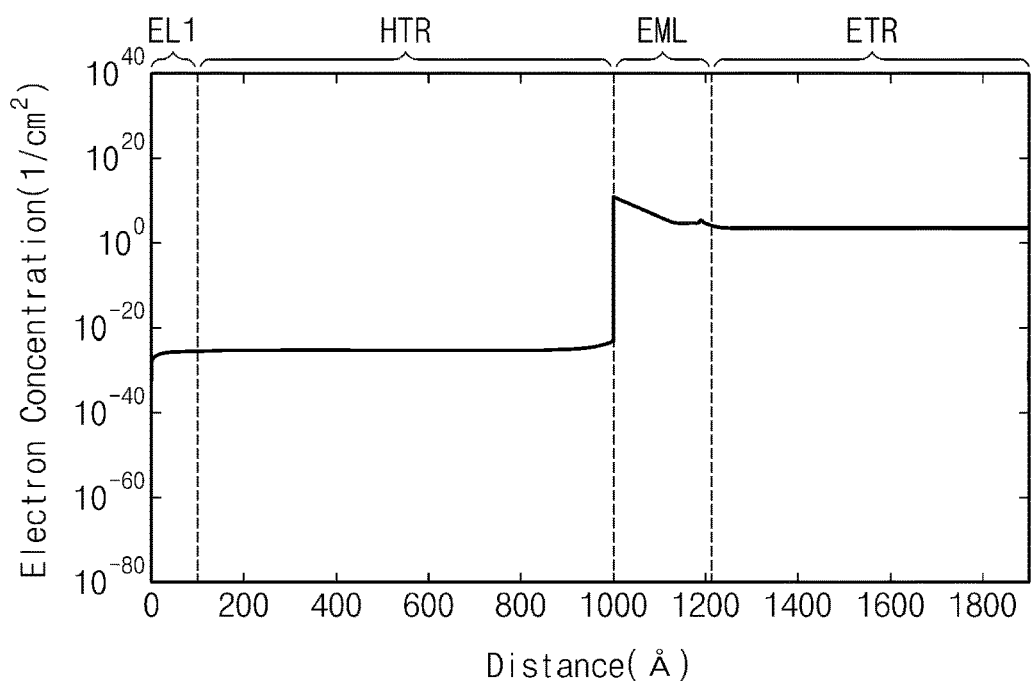
FIG. 13B is a graph showing simulation results of electron concentrations for each layer of a light emitting element according to one or more embodiments.

FIGS. 13A and 13B are graphs showing simulation results of electron concentrations for each layer of a light emitting element. FIG. 13A is a light emitting element according to Comparative Example, and includes a quantum dot to which a Comparative Example ligand without a radical reactive group is bonded. FIG. 13B is a light emitting element according to one or more embodiments, and includes a surface-modified quantum dot MQD after the reaction of FIG. 11. All other conditions are the same.

COMPARATIVE EXAMPLE

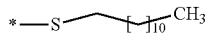

Referring to FIGS. 13A and 13B, it is seen that in the light emitting element of Comparative Example, electron concentrations at an interface between the emission layer and the hole transport region, and at an interface between the emission layer and the electron transport region are significantly reduced. Without being bound by any particular theory, it is believed that this is at least in part due to the presence of an organic ligand preventing (or significantly reducing) electron injection in the emission layer. In contrast, for the light emitting element including the surface-modified quantum dot of one or more embodiments of the present disclosure, it is seen that the dispersibility is excellent (or improved) in the quantum dot composition, and the electron transfer of the emission layer is enhanced, and thus electron concentrations at the interfaces between the emission layer, the hole transport region, and the electron transport region stay the same or substantially the same. Without being bound by any particular theory, it is believed that this effect is at least in part due to a part of the ligand preventing (or significantly reducing) electron injection being effectively (or suitably) removed. Accordingly, the light emitting element to which the ligand structure according to one or more embodiments of the present disclosure is applied is expected to exhibit improved luminous efficiency.

Figure 14:
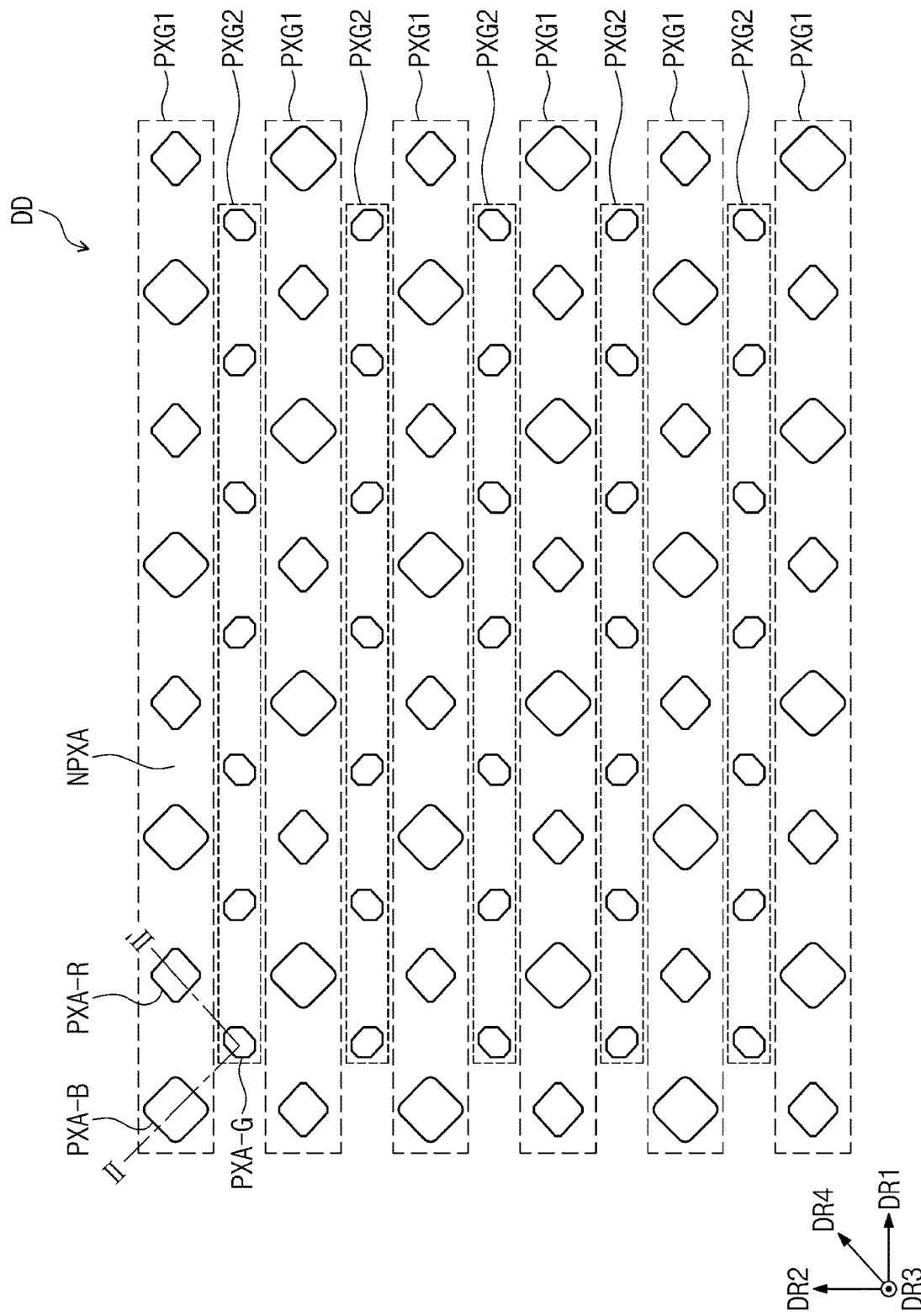
FIG. 14 is a plan view of a display device according to one or more embodiments.
Figure 15:
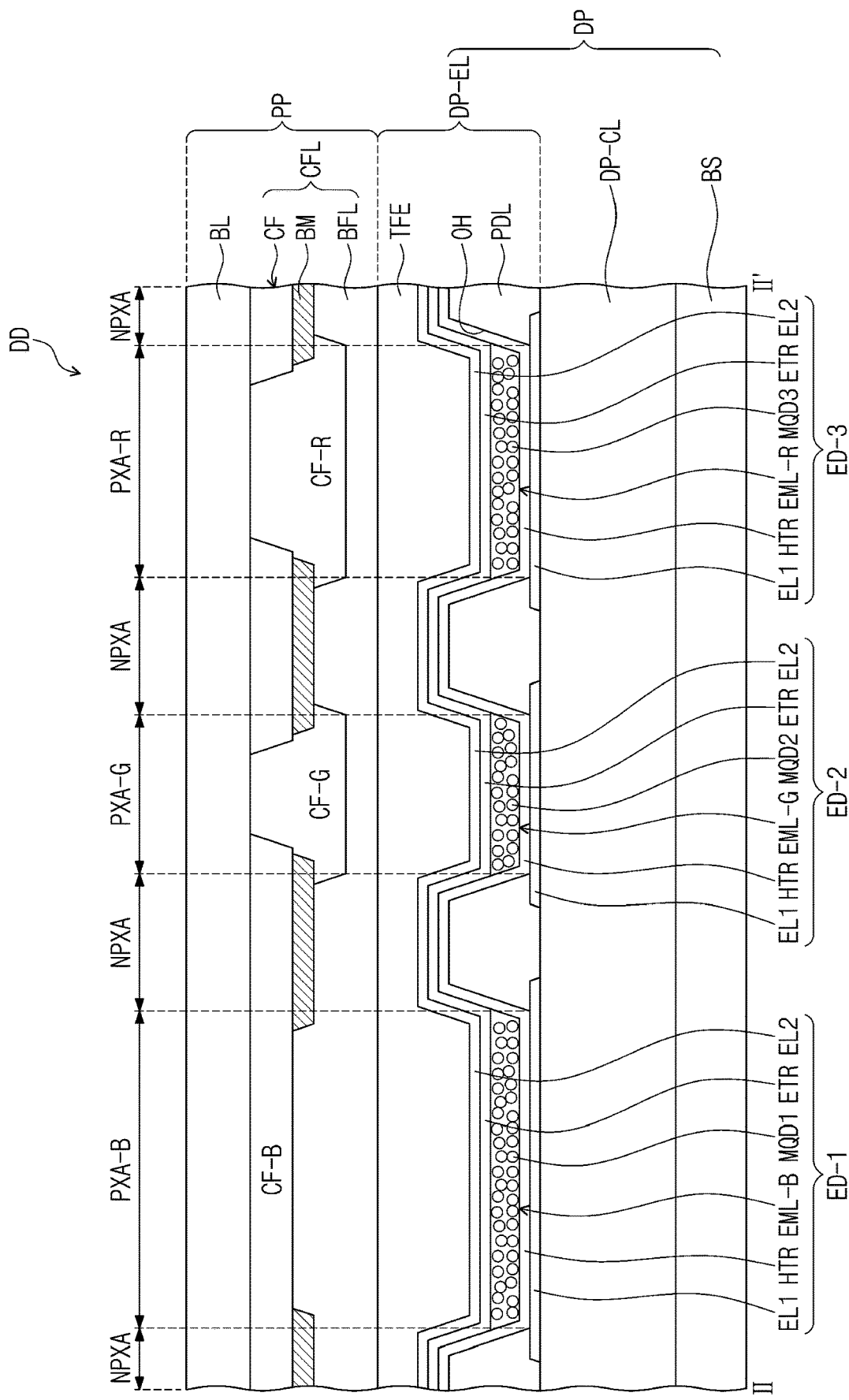
FIG. 15 is a cross-sectional view of a display device according to one or more embodiments, corresponding to line II-II' of FIG. 14.

FIG. 14 is a plan view of a display device DD according to one or more embodiments. FIG. 15 is a cross-sectional view of a display device DD according to one or more embodiments. FIG. 15 is a cross-sectional view corresponding to line II-II' of FIG. 14.

The display device DD of one or more embodiments may include a plurality of light emitting elements ED-1, ED-2, and ED-3, and the light emitting elements ED-1, ED-2, and ED-3 may respectively include emission layers EML-B, EML-G, and EML-R having surface-modified quantum dots MQD1, MQD2, and MQD3, and residues.

In one or more embodiments, the display device DD may include a display panel DP containing the plurality of light emitting elements ED-1, ED-2 and ED-3, and a light control layer PP disposed on the display panel DP. In one or more embodiments, the light control layer PP may be omitted from the display device DD of one or more embodiments.

The display panel DP may include a base substrate BS, a circuit layer DP-CL, and a display element layer DP-EL provided on the base substrate BS, and the display element layer DP-EL may include a pixel defining film PDL, light emitting elements ED-1, ED-2 and ED-3 disposed between regions of the pixel defining film PDL, and an encapsulation layer TFE disposed on the light emitting elements ED-1, ED-2 and ED-3.

Referring to FIGS. 14 and 15, the display device DD may include a non-light emission area NPXA and light emission areas PXA-B, PXA-G and PXA-R. Each of the light emission areas PXA-B, PXA-G and PXA-R may be an area emitting light generated from each of the light emitting elements ED-1, ED-2 and ED-3, respectively.

The light emission areas PXA-B, PXA-G and PXA-R may be spaced apart from one another on a plane.

The light emission areas PXA-B, PXA-G and PXA-R may be divided into a plurality of groups according to the color of light generated from the light emitting elements ED-1, ED-2 and ED-3. In the display device DD of one or more embodiments illustrated in FIGS. 14 and 15, three light emission areas PXA-B, PXA-G and PXA-R emitting blue light, green light, and red light respectively are exemplarily illustrated. For example, the display device DD of one or more embodiments may include a blue light emission area PXA-B, a green light emission area PXA-G and a red light emission area PXA-R, which are separated from one another.

The plurality of light emitting elements ED-1, ED-2 and ED-3 may emit light in different wavelength regions. For example, in one or more embodiments, the display device DD may include a first light emitting element ED-1 emitting blue light, a second light emitting element ED-2 emitting green light, and a third light emitting element ED-3 emitting red light. However, the embodiments of the present disclosure are not limited thereto, and the first to third light emitting elements ED-1, ED-2 and ED-3 may emit light in the same wavelength region or emit light in at least one different wavelength region.

For example, the blue light emission area PXA-B, the green light emission area PXA-G, and the red light emission area PXA-R of the display device DD may correspond to the first light emitting element ED-1, the second light emitting element ED-2, and the third light emitting element ED-3, respectively.

A first emission layer EML-B of the first light emitting element ED-1 may include a first surface-modified quantum dot MQD1. The first surface-modified quantum dot MQD1 may emit (e.g., convert light into and emit) blue light, which is first light.

The second emission layer EML-G of the second light emitting element ED-2, and the third emission layer EML-R of the third light emitting element ED-3 may include a second surface-modified quantum dot MQD2 and a third surface-modified quantum dot MQD3, respectively. The second surface-modified quantum dot MQD2 and the third surface-modified quantum dot MQD3 may emit (e.g., convert light into and emit) green light, which is second light, and red light, which is third light, respectively.

Each of the first to third surface-modified quantum dots MQD1, MQD2, and MQD3 may have a quantum dot and a ligand head portion bonded to a quantum dot surface. For each of the first to third surface-modified quantum dots MQD1, MQD2, and MQD3, the description of the surface-modified quantum dot MQD in the light emitting element of one or more embodiments described above may be equally applied.

In one or more embodiments, first to third quantum dots QD1, QD2, and QD3 of the first to third surface-modified quantum dots MQD1, MQD2, and MQD3 included in the light emitting elements ED-1, ED-2, and ED-3 may be formed of different core materials. In some embodiments, the first to third quantum dots QD1, QD2, and QD3 of the first to third surface-modified quantum dots MQD1, MQD2, and MQD3 may be formed of the same core material, or two quantum dots selected from the first to third quantum dots QD1, QD2, and QD3 may be formed of the same core material, and the rest may be formed of different core materials.

In one or more embodiments, the first to third quantum dots QD1, QD2, and QD3 of the first to third surface-modified quantum dots MQD1, MQD2, and MQD3 may have different diameters. For example, the first quantum dot QD1 included in the first light emitting element ED-1 may emit light in a relatively short wavelength range may have a relatively smaller average diameter than that of the second quantum dot QD2 of the second light emitting element ED-2 and the third quantum dot QD3 of the third light emitting element ED-3, each emitting light in a relatively long wavelength region.

In the present description, the average diameter refers to the arithmetic mean of the diameters of a plurality of quantum dots (quantum dot particles). The diameter of the quantum dot particle may be the average value of the width of the quantum dot particle in a cross section.

The relationship of the average diameters of the first to third quantum dots QD1, QD2 and QD3 is not limited to the above limitations. For example, in some embodiments, the first to third quantum dots QD1, QD2, and QD3 are different in size from one another, and in some embodiments, the first to third quantum dots QD1, QD2, and QD3 included in the light emitting elements ED-1, ED-2, and ED-3 may be similar in size. In one or more embodiments, the average diameter of two quantum dots selected from the first to third quantum dots QD1, QD2, and QD3 may be similar, and the rest may be different.

In one or more embodiments, first to third ligands of the first to third surface-modified quantum dots MQD1, MQD2, and MQD3 may be the same as or different from one another. The first to third ligands may be selected based on the light emission wavelengths of the light emitting elements ED-1, ED-2, and ED-3 including the first to third surface-modified quantum dots MQD1, MQD2, and MQD3.

In the display device DD of one or more embodiments, as shown in FIGS. 14 and 15, the areas of the light emission areas PXA-B, PXA-G and PXA-R each may be different from one another. In this case, the area of the light emission area may refer to an area when viewed on a plane defined by the first direction DR1 and the second direction DR2.

The light emission areas PXA-B, PXA-G and PXA-R may have different areas according to the color emitted from the emission layers EML-B, EML-G and EML-R of the light emitting elements ED-1, ED-2 and ED-3. For example, referring to FIGS. 14 and 15, the blue light emission area PXA-B corresponding to the first light emitting element ED-1 emitting blue light may have the largest area, and the green light emission area PXA-G corresponding to the second light emitting element ED-2 generating green light may have the smallest area in the display device DD of one or more embodiments. However, the embodiments of the present disclosure are not limited thereto, and the light emission areas PXA-B, PXA-G and PXA-R may emit light other than blue light, green light and/or red light, or the light emission areas PXA-B, PXA-G and PXA-R may have the same area, or the light emission areas PXA-B, PXA-G, and PXA-R may be provided at different area ratios from those shown in FIG. 14.

Each of the light emission areas PXA-B, PXA-G and PXA-R may be an area separated by a pixel defining film PDL. The non-light emission areas NPXA may be areas between neighboring light emission areas PXA-B, PXA-G and PXA-R, and may correspond to regions of the pixel defining film PDL. Meanwhile, in the present description, each of the light emission areas PXA-B, PXA-G and PXA-R may correspond to a pixel. The pixel defining film PDL may separate the light emitting elements ED-1, ED-2 and ED-3. The emission layers EML-B, EML-G and EML-R of the light emitting elements ED-1, ED-2 and ED-3 may be disposed in a respective opening OH defined by the pixel defining film PDL, and the light emitting elements ED-1, ED-2 and ED-3 may be separated from one another.

The pixel defining film PDL may be formed of a polymer resin. For example, the pixel defining film PDL may be formed including a polyacrylate-based resin and/or a polyimide-based resin. In one or more embodiments, the pixel defining film PDL may be formed by further including an inorganic material, in addition to the polymer resin. The pixel defining film PDL may be formed including a light absorbing material, or may be formed including a black pigment and/or a black dye. The pixel defining film PDL formed including a black pigment and/or a black dye may be a black pixel defining film. When forming the pixel defining film PDL, carbon black may be used as a black pigment and/or a black dye, but the embodiments of the present disclosure are not limited thereto.

In one or more embodiments, the pixel defining film PDL may be formed of an inorganic material. For example, the pixel defining film PDL may be formed including silicon nitride (SiNx), silicon oxide (SiOx), silicon oxide (SiOxNy), etc. The pixel defining film PDL may define light emission areas PXA-B, PXA-G, and PXA-R. The light emission areas PXA-B, PXA-G, and PXA-R, and a non-light emission area NPXA may be separated by the pixel defining film PDL.

Each of the light emitting elements ED-1, ED-2 and ED-3 may include a first electrode EL1, a hole transport region HTR, emission layers EML-B, EML-G and EML-R, respectively, an electron transport region ETR, and a second electrode EL2. The description in FIG. 4 may be equally applied to the first electrode EL1, the hole transport region HTR, the electron transport region ETR, and the second electrode EL2, except that the first to third surface-modified quantum dots MQD1, MQD2, and MQD3 included in the emission layers EML-B, EML-G, and EML-R are different from one another in the light emitting elements ED-1, ED-2, and ED-3 included in the display device DD of one or more embodiments. In one or more embodiments, each of the light emitting elements ED-1, ED-2, and ED-3 may further include a capping layer between the second electrode EL2 and the encapsulation layer TFE.

An encapsulation layer TFE may cover the light emitting elements ED-1, ED-2 and ED-3. The encapsulation layer TFE may be a single layer or a laminated layer including a plurality of layers. The encapsulation layer TFE may be a thin film encapsulation layer. The encapsulation layer TFE protects the light emitting elements ED-1, ED-2 and ED-3. The encapsulation layer TFE may cover an upper surface of the second electrode EL2 disposed in the opening OH, and may fill the opening OH.

While in FIG. 15, the hole transport region HTR and the electron transport region ETR are each illustrated as a common layer covering the pixel defining film PDL, but the embodiments of the present disclosure are not limited thereto. In one or more embodiments, the hole transport region HTR and the electron transport region ETR may be disposed in (e.g., just in) the opening OH defined by the pixel defining film PDL.

For example, when the hole transport region HTR and the electron transport region ETR, in addition to the emission layers EML-B, EML-G, and EML-R, are provided through an inkjet printing method, the hole transport region HTR, the emission layers EML-B, EML-G, and EML-R, the electron transport region ETR, etc. may be provided to correspond to the defined opening OH between the pixel defining layer PDL. However, the embodiment is not limited thereto, and as shown in FIG. 15, the hole transport region HTR and the electron transport region ETR may cover the pixel defining layer PDL without being patterned, and be provided as one common layer regardless of a method of providing each functional layer.

While in the display device DD of one or more embodiments illustrated in FIG. 15, the thicknesses of the emission layers EML-B, EML-G, and EML-R of the first to third light emitting elements ED-1, ED-2, and ED-3 are illustrated to be similar to one another, the embodiments are not limited thereto. For example, in one or more embodiments, the thicknesses of the emission layers EML-B, EML-G, and EML-R of the first to third light emitting elements ED-1, ED-2, and ED-3 may be different from one another.

Referring to FIG. 14, the blue light emission areas PXA-B and the red light emission areas PXA-R may be alternately arranged in the first direction DR1 to form a first group PXG1. The green light emission areas PXA-G may be arranged in the first direction DR1 to form a second group PXG2.

The first group PXG1 and the second group PXG2 may be spaced apart in the second direction DR2. Each of the first group PXG1 and the second group PXG2 may be provided in plural. The first groups PXG1 and the second groups PXG2 may be alternately arranged in the second direction DR2.

One green light emission area PXA-G may be disposed spaced apart from one blue light emission area PXA-B or one red light emission area PXA-R in the fourth direction DR4. The fourth direction DR4 may be a direction between the first direction DR1 and the second direction DR2.

The arrangement structure of the light emission areas PXA-B, PXA-G and PXA-R shown in FIG. 14 may have a PenTile®/PENTILE® structure or pattern (PENTILE® is a registered trademark owned by Samsung Display Co., Ltd.). However, the arrangement structure of the light emission areas PXA-B, PXA-G and PXA-R in the display device DD according to one or more embodiments is not limited to the arrangement structure shown in FIG. 14. For example, in one or more embodiments, the light emission areas PXA-B, PXA-G and PXA-R may have a stripe structure in which the blue light emission area PXA-B, the green light emission area PXA-G, and the red light emission area PXA-R may be alternately arranged along the first direction DR1.

Referring to FIG. 15, the display device DD of one or more embodiments further includes a light control layer PP. The light control layer PP may block or reduce external light incident to the display panel DP from the outside of the display device DD. For example, the light control layer PP may block or reduce a part of external light. The light control layer PP may perform a reflection preventing (or reflection reducing) function minimizing (or reducing) reflection due to external light.

In one or more embodiments illustrated in FIG. 15, the light control layer PP may include a color filter layer CFL. For example, the display device DD of one or more embodiments may further include the color filter layer CFL disposed on the light emitting elements ED-1, ED-2, and ED-3 of the display panel DP.

In the display device DD of one or more embodiments, the light control layer PP may include a base layer BL and a color filter layer CFL.

The base layer BL may be a member providing a base surface on which the color filter layer CFL is disposed. The base layer BL may be a glass substrate, a metal substrate, a plastic substrate, etc. However, the embodiments of the present disclosure are not limited thereto, and the base layer BL may be an inorganic layer, an organic layer, or a composite material layer (e.g., including an organic material and an inorganic material).

The color filter layer CFL may include a light blocking unit BM and a color filter CF. The color filter may include a plurality of filters CF-B, CF-G, and CF-R. For example, the color filter layer CFL may include a first filter CF-B to transmit a first color light, a second filter CF-G to transmit a second color light, and a third filter CF-R to transmit a third color light. For example, the first filter CF-B may be a blue filter, the second filter CF-G may be a green filter, and the third filter CF-R may be a red filter.

Each of the filters CF-B, CF-G, and CF-R may include a polymer photosensitive resin, and a pigment and/or a dye. The first filter CF-B may include a blue pigment and/or a blue dye, the second filter CF-G may include a green pigment and/or a green dye, and the third filter CF-R may include a red pigment and/or a red dye.

However, the embodiments of the present disclosure are not limited thereto, and the first filter CF-B may not include a pigment or a dye. The first filter CF-B may include a polymer photosensitive resin, but not include a pigment or a dye. The first filter CF-B may be transparent. The first filter CF-B may be formed of a transparent photosensitive resin.

The light blocking unit BM may be a black matrix. The light blocking unit BM may be formed including an organic light blocking material or an inorganic light blocking material, each of which may include a black pigment and/or a black dye. The light blocking unit BM may prevent or reduce light leakage, and separate boundaries between the adjacent filters CF-B, CF-G, and CF-R.

The color filter layer CFL may further include a buffer layer BFL. For example, the buffer layer BFL may be a protection layer protecting the filters CF-B, CF-G, and CF-R. The buffer layer BFL may be an inorganic material layer including at least one inorganic material among silicon nitride, silicon oxide, and silicon oxynitride. The buffer layer BFL may be formed of a single layer or a plurality of layers.

In one or more embodiments shown in FIG. 15, the first color filter CF-B of the color filter layer CFL is illustrated to overlap the second filter CF-G and the third filter CF-R, but the embodiments of the present disclosure are not limited thereto. For example, the first to third filters CF-B, CF-G and CF-R may be separated by the light blocking unit BM and may not overlap one another. In one or more embodiments, the first to third filters CF-B, CF-G and CF-R may be disposed correspondingly to, respectively, the blue light emission area PXA-B, the green light emission area PXA-G, and the red light emission area PXA-R.

In one or more embodiments, the display device DD may include a polarizing layer as a light control layer PP, instead of the color filter layer CFL. The polarizing layer may block or reduce external light provided to the display panel DP from the outside. The polarizing layer may block or reduce a part of external light.

In one or more embodiments, the polarizing layer may reduce reflected light generated in the display panel DP by external light. For example, the polarizing layer may function to block or reduce reflected light, where light provided from the outside the display device DD is incident to the display panel DP and exits again. The polarizing layer may be a circular polarizer having a reflection preventing (or reflection reducing) function, or the polarizing layer may include a linear polarizer and a λ/4 phase retarder. In one or more embodiments, the polarizing layer may be disposed on the base layer BL to be exposed, or the polarizing layer may be disposed under the base layer BL.

Figure 16:
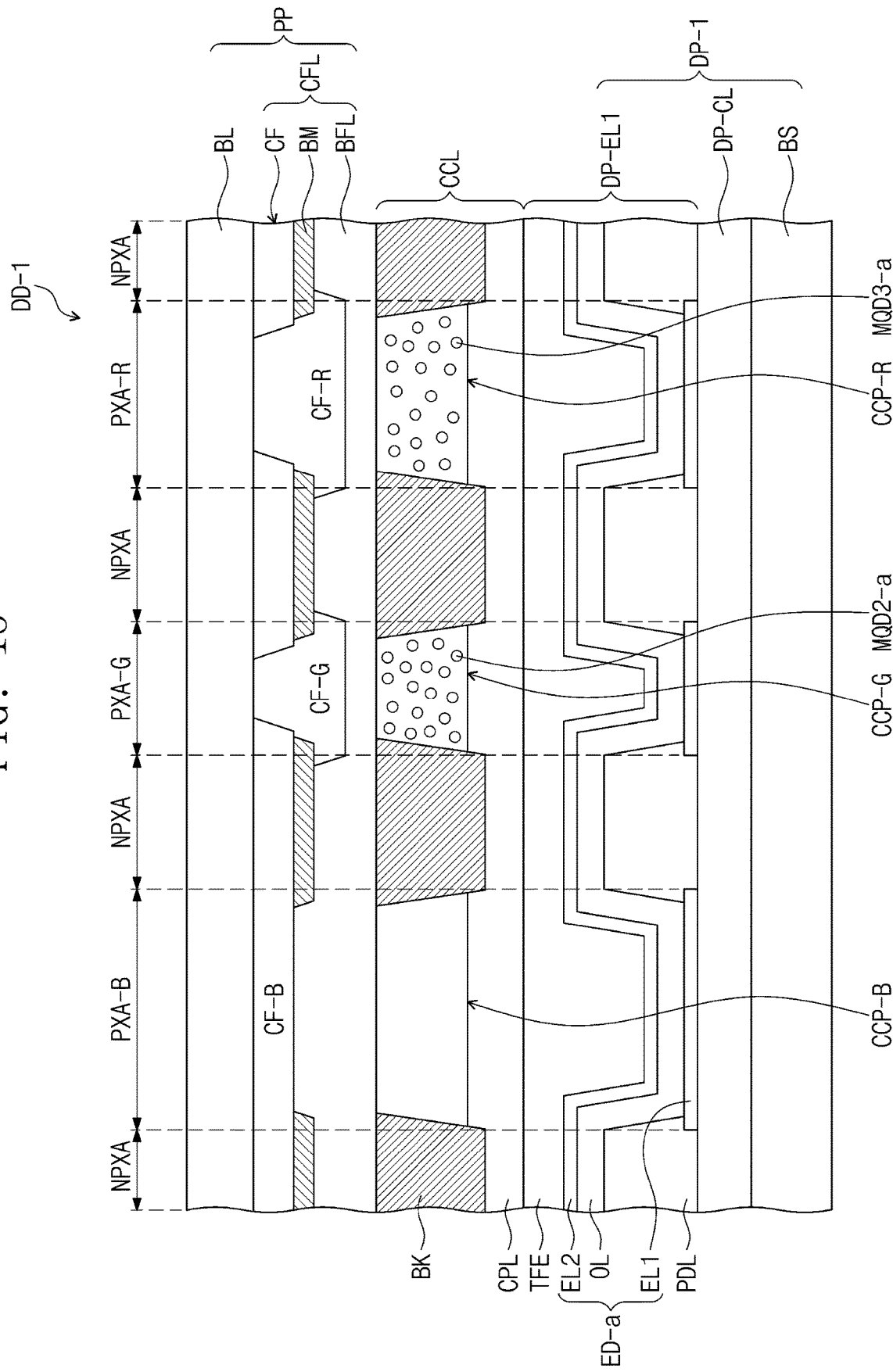
FIG. 16 is a cross-sectional view of a display device according to one or more embodiments.

FIG. 16 is a cross-sectional view of a display device DD-1 of one or more other embodiments of the present disclosure. In the description of the display device DD-1 according to one or more other embodiments, descriptions of the elements that are the same as those described above with reference to FIGS. 1 to 15 will not be repeated again, and the differences will be mainly described.

Referring to FIG. 16, the display device DD-1 may include a light conversion layer CCL disposed on a display panel DP-1. In addition, the display device DD-1 may further include a color filter layer CFL. The color filter layer CFL may be disposed between the base layer BL and the light conversion layer CCL.

The display panel DP-1 may be a light emitting display panel. For example, the display panel DP-1 may be an organic electroluminescence display panel or a quantum dot light emitting display panel.

The display panel DP-1 may include a base substrate BS, a circuit layer DP-CL provided on the base substrate BS, and a display element layer DP-EL1.

The display element layer DP-EL1 includes a light emitting element ED-a, and the light emitting element ED-a may include a first electrode EL1 and a second electrode EL2 facing each other, and a plurality of layers OL disposed between the first electrode EL1 and the second electrode EL2. The plurality of layers OL may include a hole transport region HTR (FIG. 4), an emission layer EML (FIG. 4), and an electron transport region ETR (FIG. 4). An encapsulation layer TFE may be disposed on the light emitting element ED-a.

In the light emitting element ED-a, the same descriptions as those provided with reference to FIG. 4 may be applied to the first electrode EU, the hole transport region HTR, the electron transport region ETR, and the second electrode EL2. In the light emitting element ED-a included in the display panel DP-1 of one or more embodiments, the emission layer may include a host and a dopant, which are organic electroluminescent materials, or may include the surface-modified quantum dot described with reference to FIGS. 1 to 13. In the display panel DP-1 of one or more embodiments, the light emitting element ED-a may emit blue light.

The light conversion layer CCL may include a plurality of partition walls BK spaced apart from each other, and light control units CCP-B, CCP-G and CCP-R disposed between the partition walls BK. The partition walls BK may be formed including a polymer resin and a coloring additive. The partition walls BK may be formed including a light absorbing material, or formed including a pigment and/or a dye. For example, the partition walls BK may include a black pigment and/or a black dye to implement a black partition wall. When forming the black partition wall, carbon black and/or the like may be used as a black pigment and/or a black dye, but the embodiments of the present disclosure are not limited thereto.

The light conversion layer CCL may include a first light control unit CCP-B to transmit first light, a second light control unit CCP-G including a fourth surface-modified quantum dot MQD2-*a* to convert the first light to second light, and a third light control unit CCP-R including a fifth surface-modified quantum dot MQD3-*a* to convert the first light to third light. The second light may be light of a longer wavelength region than the first light, and the third light may be light of a longer wavelength region than that of each of the first light and the second light. For example, the first light may be blue light, the second light may be green light, and the third light may be red light. Regarding surface-modified quantum dots MQD2-*a* and MQD3-*a* included in the light control units CCP-B, CCP-G and CCP-R, the same description as the one provided for the surface-modified quantum dots used in the emission layer illustrated in FIG. 14 may be applied.

The light conversion layer CCL may further include a capping layer CPL. The capping layer CPL may be disposed on the light control units CCP-B, CCP-G and CCP-R, and the partition walls BK. The capping layer CPL may serve to prevent or reduce penetration of moisture and/or oxygen (hereinafter, referred to as "moisture/oxygen"). The capping layer may be disposed on the light control units CCP-B, CCP-G and CCP-R to prevent or reduce the exposure of the light control units CCP-B, CCP-G and CCP-R to moisture/oxygen. The capping layer CPL may include at least one inorganic layer.

The display device DD-1 of one or more embodiments may include a color filter layer CFL disposed on the light conversion layer CCL, and the descriptions provided in FIG. 15 may be equally applied to the color filter layer CFL and the base layer BL.

A quantum dot composition of one or more embodiments may be used as an emission layer material capable of exhibiting improved luminous efficiency properties by binding a ligand, that may later be removed, to a surface of a quantum dot. When the resulting quantum dot composition is applied to an emission layer, degradation of electron injection properties may be prevented or reduced.

A light emitting element and a display device of one or more embodiments may exhibit improved luminous efficiency and service life, including, in an emission layer, a quantum dot without degradation of electron injection properties.

Although the present disclosure has been described with reference to the example embodiments of the present disclosure, it will be understood that the present disclosure should not be limited to these example embodiments, but that various changes and modifications can be made by those skilled in the art without departing from the spirit and scope of the present disclosure.

Accordingly, the technical scope of the present disclosure is not intended to be limited to the contents set forth in the detailed description of the specification, but is intended to be defined by the appended claims and their equivalents.

What is claimed is:

1. A quantum dot composition comprising:
    a quantum dot comprising a core, a shell around the core and a ligand which is bonded a surface of the shell, and being a semiconductor nanocrystal; and
    a nonionic photoacid generator.

2. The quantum dot composition of claim 1, wherein the ligand comprises:
    a head portion bonded to the surface of the quantum dot; and
    a tail portion comprising at least one radical reactive group.

3. The quantum dot composition of claim 2, wherein the at least one radical reactive group is a carbonyl group, an ester group, an ether group, a peroxy group, an azo group, a carbamate group, a thiocarbamate group, a carbonate group, or a xanthate group.

4. The quantum dot composition of claim 1, wherein the ligand is a monodentate ligand or a bidentate ligand.

5. The quantum dot composition of claim 2, wherein the head portion comprises a thiol group, a dithio acid group, a phosphine group, a catechol group, an amine group, or a carboxylic acid group.

6. The quantum dot composition of claim 5, wherein the head portion further comprises an alkyl group having 1 to 5 carbon atoms.

7. The quantum dot of composition claim 2, wherein the tail portion is represented by at least one among Formula 1-1 to Formula 1-11:

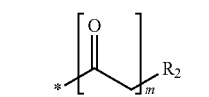

[Formula 1-1]

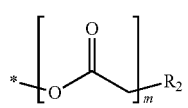

[Formula 1-2]

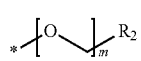

[Formula 1-3]

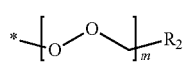

[Formula 1-4]

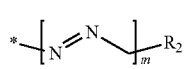

[Formula 1-5]

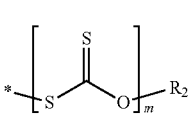

[Formula 1-6]

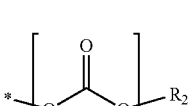

[Formula 1-7]

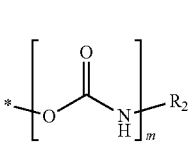

[Formula 1-8]

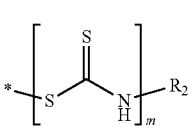

[Formula 1-9]

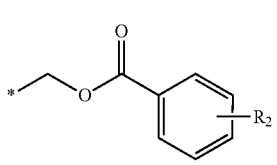

[Formula 1-10]

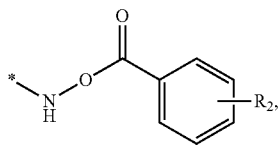

[Formula 1-11]

and wherein in Formulae 1-1 to 1-11,
$R_2$ is an alkyl group having 1 to 20 carbon atoms, and
m is an integer of 1 to 5.

8. The quantum dot composition of claim 1, wherein the nonionic photoacid generator is in an amount of 0.1 wt % to 1 wt % with respect to a total amount of the quantum dot having the ligand bonded to the surface thereof.

9. The quantum dot composition of claim 1, wherein the quantum dot composition further comprises an organic solvent, and
wherein the quantum dot is dispersed in the organic solvent.

10. The quantum dot composition of claim 9, wherein the quantum dot having the ligand bonded to the surface thereof is in an amount of 0.5 wt % to 10 wt % based on a total amount of the quantum dot composition.

11. A light emitting element comprising:
a first electrode;
a hole transport region on the first electrode;
an emission layer on the hole transport region;
an electron transport region on the emission layer; and
a second electrode on the electron transport region,
wherein the emission layer comprises a quantum dot having a surface to which a hydrophilic group is bonded.

12. The light emitting element of claim 11, wherein the emission layer further comprises residues comprising a radical reactive group.

13. The light emitting element of claim 12, wherein the residues comprise a compound represented by at least one among Formula 2-1 to Formula 2-11:

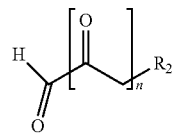

[Formula 2-1]

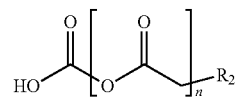

[Formula 2-2]

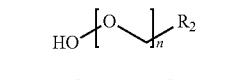

[Formula 2-3]

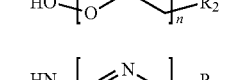

[Formula 2-4]

[Formula 2-5]

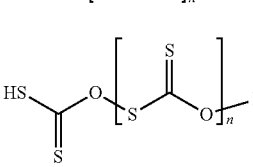

[Formula 2-6]

[Formula 2-7]
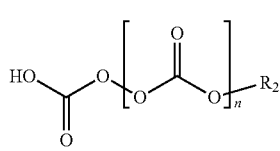

[Formula 2-8]
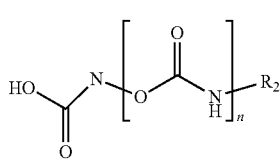

[Formula 2-9]
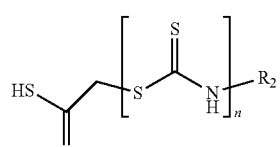

[Formula 2-10]
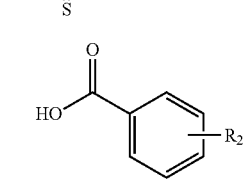

[Formula 2-11]
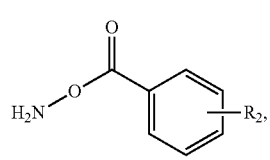

and wherein in Formulae 2-1 to 2-11, $R_2$ is an alkyl group having 1 to 20 carbon atoms, and n is an integer of 0 to 4.

14. A method for manufacturing a light emitting element, the method comprising:

forming a hole transport region on a first electrode;

forming an emission layer on the hole transport region;

forming an electron transport region on the emission layer; and forming a second electrode on the electron transport region, wherein the forming of the emission layer comprises:

preparing a quantum dot composition comprising:

a quantum dot having a surface to which a ligand is bonded, and a nonionic photoacid generator;

applying the quantum dot composition on the hole transport region to form a preliminary emission layer; and applying ultraviolet (UV) light to the preliminary emission layer.

15. The method of claim 14, wherein the preparing of the quantum dot composition comprises dispersing the quantum dot having the ligand bonded to the surface of the quantum dot, and the photoacid generator, in an organic solvent.

16. The method of claim 14, wherein the photoacid generator is in an amount of 0.1 wt % to 1 wt % with respect to a total amount of the quantum dot having the ligand bonded to the surface of the quantum dot.

17. The method of claim 14, wherein the applying of the UV light comprises irradiating ultraviolet (UV) light with a light amount of about 10 mJ/cm$^2$ to about 100 mJ/cm$^2$.

18. The method of claim 14, wherein the quantum dot comprises a core and a shell around the core, and the ligand comprises a hydrophilic group bonded to the surface of the quantum dot, and a radical reactive group.

19. The method of claim 18, wherein the hydrophilic group is a thiol group, a dithio acid group, a phosphine group, a catechol group, an amine group, or a carboxylic acid group.

20. The method of claim 18, wherein the ligand further comprises an alkyl group having 1 to 5 carbon atoms, the alkyl group connecting the hydrophilic group and the radical reactive group.

21. The method of claim 15, wherein the quantum dot having the ligand bonded to the surface thereof is in an amount of about 0.5 wt % to about 5 wt % based on a total amount of the quantum dot composition.

* * * * *